United States Patent
Kim

(10) Patent No.: US 12,279,453 B2
(45) Date of Patent: Apr. 15, 2025

(54) SEMICONDUCTOR DEVICE

(71) Applicant: Magnachip Mixed-Signal, Ltd., Cheongju-si (KR)

(72) Inventor: Guk Hwan Kim, Cheongju-si (KR)

(73) Assignee: Magnachip Mixed-Signal, Ltd., Cheongju-si (KR)

( * ) Notice: Subject to any disclaimer, the term of this patent is extended or adjusted under 35 U.S.C. 154(b) by 772 days.

(21) Appl. No.: 17/376,557

(22) Filed: Jul. 15, 2021

(65) Prior Publication Data

US 2022/0052156 A1  Feb. 17, 2022

(30) Foreign Application Priority Data

Aug. 12, 2020  (KR) .................. 10-2020-0100930

(51) Int. Cl.
| | | |
|---|---|---|
| *H01L 29/06* | (2006.01) | |
| *H01L 29/78* | (2006.01) | |
| *H10D 30/65* | (2025.01) | |
| *H10D 62/10* | (2025.01) | |
| *H10D 64/27* | (2025.01) | |

(52) U.S. Cl.
CPC .......... *H10D 62/116* (2025.01); *H10D 30/65* (2025.01); *H10D 64/516* (2025.01)

(58) Field of Classification Search
CPC .......... H01L 29/7835; H01L 29/66659; H01L 29/4933; H01L 21/28518; H01L 29/66681; H01L 29/7833; H01L 29/7816; H01L 29/0653; H01L 21/28052; H10D 30/0281; H10D 30/65; H10D 30/603
See application file for complete search history.

(56) References Cited

U.S. PATENT DOCUMENTS

| | | | |
|---|---|---|---|
| 5,741,737 A * | 4/1998 | Kachelmeier | ..... H01L 21/28167 438/981 |
| 9,871,063 B1 | 1/2018 | Oh et al. | |
| 10,566,422 B2 | 2/2020 | Lee et al. | |
| 10,727,300 B2 | 7/2020 | Kim et al. | |
| 2003/0025163 A1 | 2/2003 | Kwon | |

(Continued)

FOREIGN PATENT DOCUMENTS

| | | |
|---|---|---|
| DE | 10 2020 124 781 A1 | 10/2021 |
| KR | 10-2009-0073487 A | 7/2009 |

(Continued)

OTHER PUBLICATIONS

German Office Action issued on May 23, 2023, in counterpart German Patent Application No. 10 2021 120 897.1 (10 pages in English, 10 pages in German).

(Continued)

*Primary Examiner* — John A Bodnar
(74) *Attorney, Agent, or Firm* — NSIP Law

(57) ABSTRACT

A semiconductor device includes a source region, a drain region, and a gate dielectric layer formed on a substrate; a gate electrode formed on the gate dielectric layer; a first dielectric pattern, formed contacting a sidewall of the gate electrode, extending from the source region to a portion of an upper surface of the gate electrode; a spacer formed on another sidewall of the gate electrode between the gate electrode and the drain region; and a gate silicide layer formed between the first dielectric pattern and the spacer.

30 Claims, 18 Drawing Sheets

(56) References Cited

U.S. PATENT DOCUMENTS

| | | |
|---|---|---|
| 2009/0166765 A1 | 7/2009 | Lee |
| 2010/0244965 A1* | 9/2010 | Shima ................. H01L 29/7835 |
| | | 257/E29.256 |
| 2011/0042756 A1* | 2/2011 | Hikida .................. H01L 29/665 |
| | | 257/E21.616 |
| 2011/0068411 A1* | 3/2011 | Sun .................. H01L 21/76804 |
| | | 257/384 |
| 2013/0299919 A1* | 11/2013 | Chen ................. H01L 29/66492 |
| | | 257/E21.409 |
| 2016/0149007 A1* | 5/2016 | Chou ..................... H01L 29/407 |
| | | 257/339 |
| 2016/0204279 A1 | 6/2016 | Horch et al. |
| 2018/0019262 A1 | 1/2018 | Oh et al. |
| 2018/0358349 A1 | 12/2018 | Hwang et al. |
| 2019/0019866 A1 | 1/2019 | Kim et al. |
| 2019/0288066 A1 | 9/2019 | Lee et al. |
| 2020/0105927 A1* | 4/2020 | Xu ...................... H01L 29/0882 |
| 2020/0251575 A1 | 8/2020 | Kim et al. |
| 2021/0313420 A1 | 10/2021 | Kim |

FOREIGN PATENT DOCUMENTS

| | | |
|---|---|---|
| KR | 2009-0073487 A | 7/2009 |
| KR | 10-2010-0079175 A | 7/2010 |
| KR | 10-2018-0009009 A | 1/2018 |
| KR | 10-2019-0008463 A | 1/2019 |
| KR | 10-2019-0109685 A | 9/2019 |
| KR | 2020-0008170 A | 1/2020 |
| KR | 10-2020-0095640 A | 8/2020 |

OTHER PUBLICATIONS

Korean Office Action issued on Oct. 9, 2021 in counterpart Korean Patent Application No. 10-2020-0100930 (13 pages in Korean).

* cited by examiner

SEMICONDUCTOR DEVICE

CROSS-REFERENCE TO RELATED APPLICATIONS

This application claims the benefit under 35 U.S.C. 119(a) of Korean Patent Application No. 10-2020-0100930 filed on Aug. 12, 2020, in the Korean Intellectual Property Office, the entire disclosure of which is incorporated herein by reference for all purposes.

BACKGROUND

1. Field

The present application relates to a semiconductor device.

2. Description of Related Art

In general, an ESD circuit is formed to protect a semiconductor device formed inside a core circuit from electrostatic discharge (ESD) or electrical over stress (EOS). In addition, to prepare for the case in which ESD or EOS enters through a gate electrode of a semiconductor device, a gate dielectric layer is formed to be thick. The gate dielectric layer is formed to be thick because when ESD or EOS is applied to a semiconductor device, a thin gate dielectric layer may be destroyed. In addition, in order to withstand ESD or EOS, a structure that increases the resistance of the gate electrode is widely used. Thus, to increase the gate electrode's resistance, a silicide-blocking dielectric layer is formed on the surface of the gate electrode. In doing so, the high ESD or EOS applied to the gate electrode may be mitigated to some extent.

However, when a high electric field such as ESD or EOS is formed, leakage current occurs between the gate electrode-drain electrode or the gate electrode-source electrode. To prevent this phenomenon, the distance between the gate electrode and the drain electrode is increased. Therefore, despite a high electric field due to ESD or EOS, leakage current between the gate electrode and the drain electrode may be blocked. However, in order to form a channel between the gate electrode and the source electrode, the source region and the gate electrode are disposed as close as possible. Due to this structure, when a high electric field is applied to the gate electrode, leakage current becomes a problem between the gate electrode and the source electrode region.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a source region, a drain region, and a gate dielectric layer formed on a substrate; a gate electrode formed on the gate dielectric layer; a first dielectric pattern, formed contacting a sidewall of the gate electrode, extending from the source region to a portion of an upper surface of the gate electrode; a spacer formed on another sidewall of the gate electrode between the gate electrode and the drain region; and a gate silicide layer formed between the first dielectric pattern and the spacer.

The spacer and the first dielectric pattern may be formed of a same material. The first dielectric pattern may directly contact the gate silicide layer, the source region, and the gate dielectric layer. The spacer may be formed in contact with the other sidewall of the gate electrode, and an end of the spacer may be formed in alignment with an end of the gate dielectric layer.

The semiconductor device may further include a silicide blocking layer formed to cover a portion of the substrate, contact the spacer, and contact the gate silicide layer.

The silicide blocking layer may be formed to be spaced apart from the first dielectric pattern.

The silicide blocking layer may be formed in contact with the gate dielectric layer and the drain region.

The silicide blocking layer may be formed to be thicker than the first dielectric pattern.

In another general aspect, a semiconductor device incudes a source region, a drain region, and a gate dielectric layer formed on a substrate; a gate electrode formed on the gate dielectric layer; a first dielectric pattern, formed in contact with a sidewall of the gate electrode, extending from the source region to a portion of an upper surface of the gate electrode; a second dielectric pattern, formed to contact another sidewall of the gate electrode, extending to another portion of the upper surface of the gate electrode; and a gate silicide layer formed between the first dielectric pattern and the second dielectric pattern.

In a plan view, the first dielectric pattern and the second dielectric pattern may be formed to meet each other and surround a periphery of the gate electrode.

In a plan view, an area of the second dielectric pattern may be formed to be larger than an area of the first dielectric pattern.

In a plan view, the first dielectric pattern and the second dielectric pattern may be in contact with each other, and the first and second dielectric patterns may be formed to cover upper surfaces of the gate electrode excluding a surface of the gate silicide layer.

The gate dielectric layer may include a first gate dielectric layer and a second gate dielectric layer thicker than the first gate dielectric layer. One end of the second dielectric pattern may be formed on an upper surface of the gate electrode, and another end of the second dielectric pattern may be formed in alignment with an end of the second gate dielectric layer.

The first and second dielectric patterns may be formed of a same material, and the first dielectric pattern may directly contact the gate silicide layer, the source region, and the gate dielectric layer.

The second dielectric pattern and the gate dielectric layer may extend, toward the drain region, further than the other sidewall of the gate electrode.

The semiconductor may further include a deep well region formed on the substrate, a well region formed in the deep well region, an extended drain junction region surrounding the drain region, and a body region surrounding the source region.

The semiconductor device may further include a drain silicide layer formed on the drain region, a drain contact plug formed on the drain silicide layer, a source silicide layer formed on the source region, and a source contact plug formed on the source silicide layer.

The semiconductor device may further include a gate contact plug formed on the gate silicide layer. The gate contact plug may be disposed to be closer to the second dielectric pattern than to the first dielectric pattern, and the gate contact plug may be formed to be spaced apart from the first and second dielectric patterns.

The semiconductor device may further include a third dielectric pattern formed, to cover a portion of the substrate and contact the second dielectric pattern, thicker than the second dielectric pattern.

The third dielectric pattern may be formed to be spaced apart from the first dielectric pattern.

The third dielectric pattern may be formed in contact with the gate dielectric layer and the drain region.

The third dielectric pattern may be formed to be thicker than the second dielectric pattern.

The third dielectric pattern may be formed to extend to the first dielectric pattern.

In another general aspect, a semiconductor device includes a source region and a drain region formed in an active region; a gate dielectric layer formed between the source region and the drain region; a gate electrode formed on the gate dielectric layer; a first dielectric pattern formed to overlap the source region and extend to a sidewall and a portion of an upper surface of the gate electrode; a second dielectric pattern formed to contact another sidewall of the gate electrode and extend to another portion of the upper surface of the gate electrode; a gate silicide layer formed between the first dielectric pattern and the second dielectric pattern; and a third dielectric pattern formed to overlap the gate electrode and the second dielectric pattern, and extend to the drain region.

The third dielectric pattern may be formed to extend to the first dielectric pattern.

In a plan view, the first dielectric pattern and the second dielectric pattern may be in contact with each other, and the first and second dielectric patterns may be formed to cover upper surfaces of the gate electrode excluding a surface of the gate silicide layer.

In a top view, the first dielectric pattern and the second dielectric pattern may be formed to meet each other, and surround a periphery of the gate electrode.

In a top view, an area of the second dielectric pattern may be larger than an area of the first dielectric pattern.

The semiconductor device may further include a drain contact formed on the drain region, a source contact formed on the source region, and a gate contact formed on the gate region.

The gate contact may be formed to be spaced apart from the first and second dielectric patterns.

The third dielectric pattern may be formed to be spaced apart from the drain contact, the gate contact, and the source contact, respectively.

The gate contact plug may be formed to be spaced apart from the first and second dielectric patterns.

The gate contact plug may be disposed to be closer to the second dielectric pattern than to the first dielectric pattern.

In another general aspect, a semiconductor device incudes a source region, a drain region, and a gate dielectric layer formed on a substrate; a gate electrode, formed on the gate dielectric layer, comprising a first gate dielectric layer and a second gate dielectric layer thicker than the first gate dielectric layer; a first dielectric pattern, formed contacting sidewalls of the gate electrode and the first gate dielectric layer, extending from the source region to a portion of an upper surface of the gate electrode; and a gate silicide layer formed on the gate electrode.

A spacer may be formed on another sidewall of the gate electrode between the gate electrode and the drain region, and the gate silicide layer may be formed between the first dielectric pattern and the spacer.

Outer sidewalls of the spacer and the second gate dielectric layer may be in alignment.

A second dielectric pattern, formed to contact another sidewall of the gate electrode, may extend to another portion of the upper surface of the gate electrode. A gate silicide layer may be formed between the first dielectric pattern and the second dielectric pattern.

Outer sidewalls of the second dielectric pattern and the second gate dielectric layer may be in alignment.

A third dielectric pattern may be formed to overlap the gate electrode and the second dielectric pattern, and extend to the drain region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
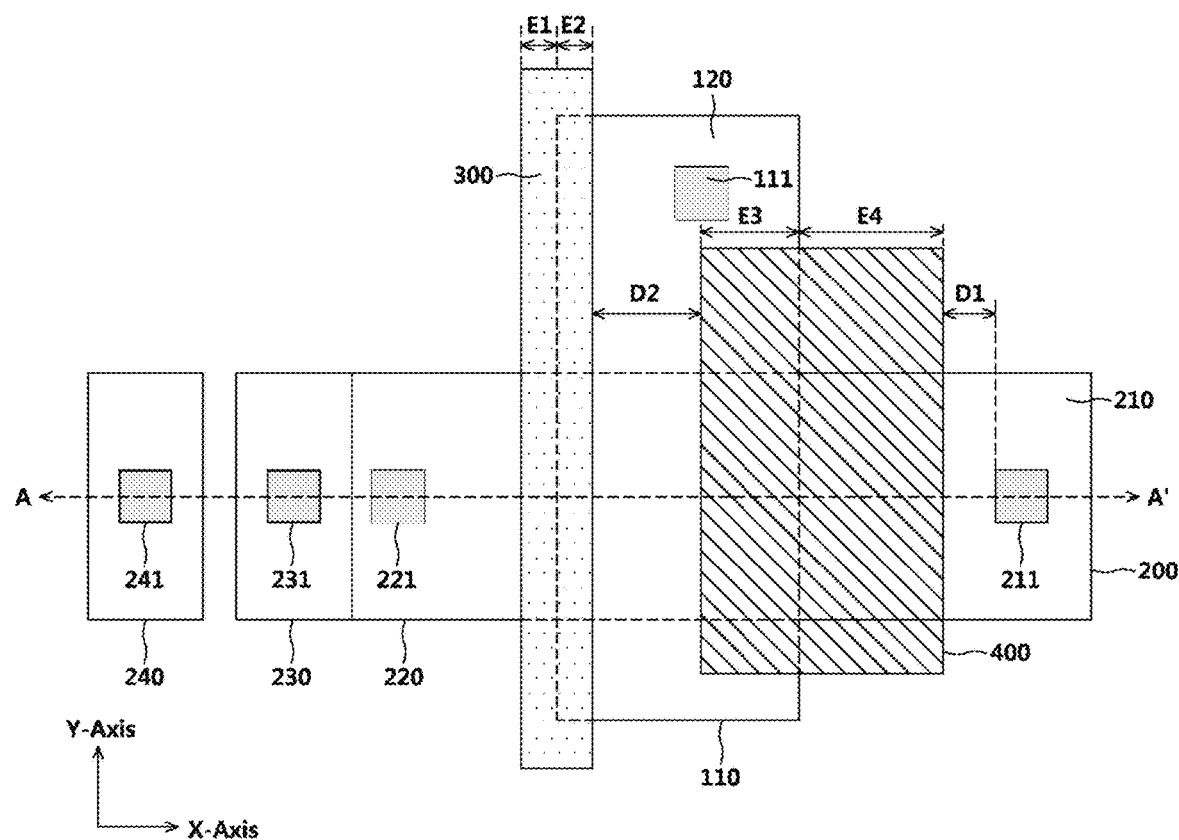
FIG. 1A is a plan view of a semiconductor device according to a first example of the present application.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present application provides a semiconductor device capable of reducing leakage current between a gate electrode and a source electrode.

In another general aspect, the present application provides a semiconductor device capable of reducing leakage current by increasing the resistance between a gate electrode and a source region.

Hereinafter, the present application is described in more detail based on the examples illustrated in the drawings.

Figure 1B:
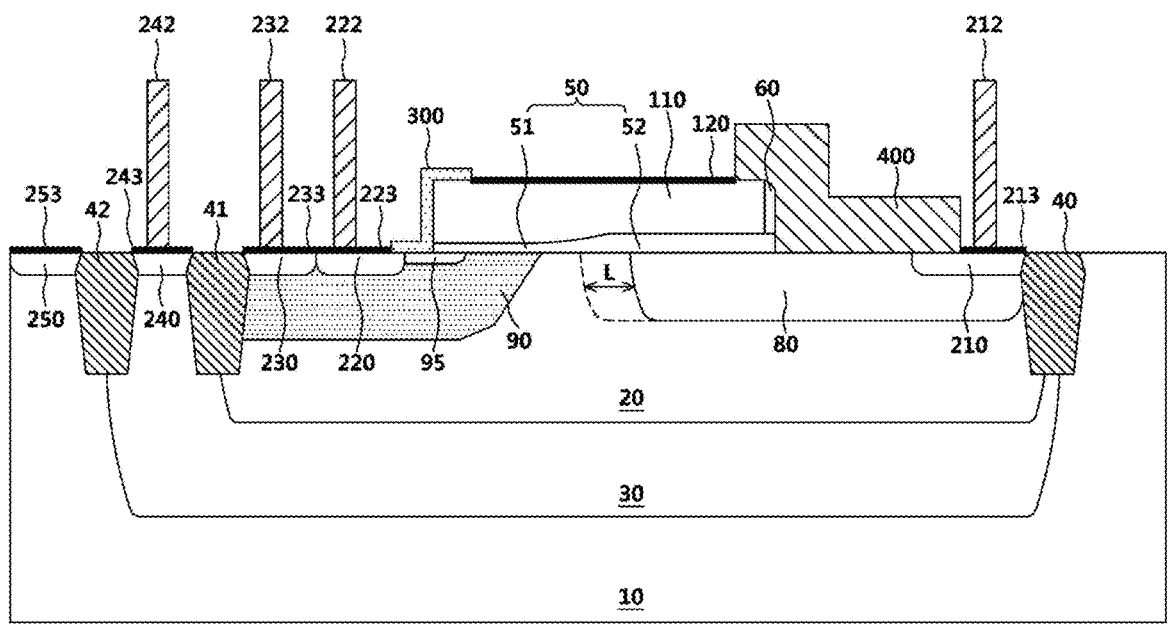
FIG. 1B is a cross-sectional view of a semiconductor device with respect to line A-A' of FIG. 1A.

FIG. 1A is a plan view of a semiconductor device according to a first example of the present application, and FIG. 1B is a cross-sectional view of the semiconductor device with respect to line A-A' of FIG. 1A.

Referring to FIG. 1A, an active region 200, including a drain region 210, a source region 220, a body pickup region 230, and a deep well pickup region 240 is formed on a substrate. Each of the regions 210, 220, 230, and 240 of the active region 200 is formed using an active mask pattern (not illustrated). The body pickup region 230 and the deep well pickup region 240 are spaced apart by a predetermined distance. A drain contact 211, a source contact 221, a body contact 231, and DNW contact 241 are formed in the drain region 210, the source region 220, the body pickup region 230, and the deep well pickup region 240 of the active region 200, respectively. One or more of the above-described contacts 211, 221, 231, and 241 may be formed to be included, respectively, in a corresponding region. The contact plugs (FIG. 1B: 212, 222, 232, 242) connected to metal wires are formed on the contacts 211, 221, 231, and 241.

A gate region 110 (a gate electrode) is formed between the source region 220 and the drain region 210. Referring to the drawing, a source region 220 is formed on the left side of the gate electrode 110, and a drain region 210 is formed on the right side. A gate contact 111 is formed on the gate electrode 110.

As illustrated in FIG. 1A, the semiconductor device includes a first dielectric pattern 300 and a third dielectric pattern 400. Because the first dielectric pattern 300 is formed by etching an LDD dielectric layer, it may be referred to as an 'LDD dielectric pattern.' In addition, the third dielectric pattern 400 is formed by using a silicon oxide layer or a silicon nitride layer material so that salicide or silicide is not formed. Because the third dielectric pattern 400 is formed in a non-sal process, it may be referred to as a 'non-sal dielectric pattern.' Alternatively, because it is a layer for preventing silicide from being formed, it may be referred to as a silicide blocking layer, a silicide blocking dielectric layer, and a silicide blocking dielectric pattern. The first dielectric pattern 300 and the third dielectric pattern 400 are formed by using respective mask patterns. Each mask pattern may be designed in various layouts corresponding to the shapes of the first dielectric pattern 300 and the third dielectric pattern 400. The first dielectric pattern 300 and the third dielectric pattern 400 may be formed of various shapes and predetermined materials, which are to be described with reference to other examples illustrated.

The first dielectric pattern 300 is formed over the source region 220 and the gate electrode 110, and is formed to be longer than the gate electrode 110. The first dielectric pattern 300 is spaced apart from the source contact 221 and the gate contact 111 and may be divided into a first region having a width of E1 and a second region having a width of E2. The width refers to the X-axis direction. The first region is located on the source region 220 side, and the second region is located on the gate electrode 110 side. As the width of E1 increases, the resistance between the gate electrode 110 and the source region 220 increases, and the leakage current between the gate electrode 110 and the source region 220 is reduced.

A gate silicide layer 120 is formed on the gate electrode 110 in a region where the first dielectric pattern 300 and the third dielectric pattern 400 are not present.

Referring to FIG. 1A, the third dielectric pattern 400 is spaced apart from the first dielectric pattern 300 by a predetermined distance D2 and is formed over the gate electrode 110 and the drain region 210. In this way, because the resistance between the gate electrode 110 and the drain region 210 increases, it may be expected that the leakage current between the gate electrode 110 and the drain region 210 is to be reduced. The third dielectric pattern 400 may be divided into a third region with a width of E3 and a fourth region with a width of E4. The third region is located on the gate electrode 110 side, and the fourth region is located on the drain region 210 side. The third dielectric pattern 400 is disposed to be spaced apart from the gate contact 111 and the drain contact 211 by a predetermined distance and has a greater width and a shorter length than the first dielectric pattern 300. It is formed in a substantially rectangular shape.

Resistance of the gate electrode 110 is increased by the first dielectric pattern 300 and the third dielectric pattern 400. Therefore, it is possible to prevent the defect of semiconductor devices caused by ESD or EOS.

Referring to FIG. 1A, the third dielectric pattern 400 and the drain contact 211 are formed to be spaced apart by a distance 'D1'. The third dielectric pattern 400 and the drain contact plug 212 may contact each other, but in such a case, the length of the drain silicide layer 213 is shortened, thereby increasing the contact resistance. Therefore, it is preferable to secure a distance 'D1' between the third dielectric pattern 400 and the drain contact plug 212.

FIG. 1B is a cross-sectional view of a semiconductor device according to an example of the present application with respect to line A-A' of FIG. 1A. Referring to the drawing, the semiconductor device includes a first conductivity type (i.e., P type) well region 20 formed at a predetermined depth on the upper surface of the substrate 10. The well region 20 is disposed between the device isolation regions 40 and 41 and is formed deeper than the device isolation regions 40 and 41.

A gate dielectric layer 50, including a first gate dielectric layer 51 and a second gate dielectric layer 52 having different thicknesses, is formed on the well region 20. The gate electrode 110 is disposed on the gate dielectric layer 50. The drain region 210 and the source region 220 are formed in the well region 20 and are disposed on opposite sides under the gate dielectric layer 50, respectively.

The gate dielectric layer 50 may include a first gate dielectric layer 51 and a second gate dielectric layer 52 having different thicknesses. The first gate dielectric layer 51 may be thinner than the second gate dielectric layer 52, and the second gate dielectric layer 52 may be formed to be thicker than the first gate dielectric layer 51. The second gate dielectric layer 52 may be further divided into two parts. The second gate dielectric layer 52 has a portion of which thickness decreases as it gets closer to the first gate dielectric layer 51, and a portion having a constant thickness toward the spacer 60. Using the gate dielectric layers 51 and 52 having different thicknesses, a level shift semiconductor device allowing a voltage used in a medium voltage or high voltage device may be implemented.

The thin first gate dielectric layer 51 is disposed near the source region 220, and the second gate dielectric layer 52, having a thick thickness, is disposed near the drain region 210. This prevents the gate dielectric layer 50 from being destroyed because the drain voltage is higher than the source voltage. For example, in case the drain voltage is over 3.3V, which is a medium voltage, and the gate voltage is about 0.5V to 2V, which is a low voltage, if only a thick gate dielectric layer is used, the drain current becomes too low, which requires a wider width of the channel region, causing a problem of increasing the area of the semiconductor device. Conversely, if only a thin gate dielectric layer is used, there is a problem that the gate dielectric layer is destroyed due to a drain voltage of a medium or higher voltage. Therefore, the above-described problem is solved through the configuration of the gate dielectric layer 50, including the thin gate dielectric layer 51 and the thick gate dielectric layer 52.

Because the drain voltage is higher than the source voltage, the gate dielectric layer 50 may be formed to be inclined so that the thickness of the gate dielectric layer 50 is reduced in a direction from the drain region 210 to the source region 220. The drain region 210 is formed to be spaced apart from the gate electrode 110 by a predetermined distance to increase the breakdown voltage.

A first dielectric pattern 300 and a spacer 60 are formed on opposite sides of the gate electrode 110 and the gate dielectric layer 50, respectively. The first dielectric pattern 300 is formed on the source region 220 side, and the source region 220 is formed overlapping a portion of the first dielectric pattern 300. In addition, a spacer 60 is formed on the drain region 210 side. The spacer 60 is formed only on the drain region 210 side, where the first dielectric pattern 300 is not present, and the first dielectric pattern 300 and the spacer 60 are formed of the same material.

The third dielectric pattern 400 is formed by being spaced apart from the first dielectric pattern 300 and extending to the drain region 210 while covering the upper surface of the gate electrode 110 and the spacer 60. The third dielectric pattern 400 is formed by covering a portion of the substrate 10, contacting the spacer 60, and contacting the silicide layer 120. The third dielectric pattern 400 is formed to be thicker than the first dielectric pattern 300. The third dielectric pattern 400 is designed to have a sufficient thickness because when the third dielectric pattern 400 is thin, it may be removed by various etching processes performed in a subsequent process. Then silicide may be formed in the removed region. A gate silicide layer 120 is formed on the gate electrode 110 between the first dielectric pattern 300 and the third dielectric pattern 400.

The semiconductor device further includes an extended drain junction region 80. The extended drain junction region 80 extends from the drain region 210 to the second gate dielectric layer 52 to provide low drain resistance. As illustrated in FIG. 1B, the extended drain junction region 80 may be disposed with a length L extended to the first gate dielectric layer 51, which is a thin gate dielectric layer. The length of the extended drain junction region 80 may be freely adjusted and disposed between the gate dielectric layers 51 and 52. The extended drain junction region 80 is formed to surround the drain region 210 by implanting ions with higher energy than the drain region 210. The extended drain junction region 80 may be formed by using an N-type impurity phosphorous or arsenic. As a result, the depth of the extended drain junction region 80 is shallower than that of the device isolation region 40 disposed next to it.

The semiconductor device may further include a P-body region 90 of a first conductivity type. The P-body region 90 is positioned under the first gate dielectric layer 51, a thin gate dielectric layer, and serves as a channel region. The P-body region 90 has a shape surrounding the source region 220, the body contact region 230, and the LDD region 95. The depth of the P-body region 90 is shallower than a device isolation region 41 disposed next to it and deeper than the depth of the extended drain junction region 80. The depth of the P-body region 90 may be greater than that of the device isolation region 41. The depth of the P-body region 90 may be identical to or thinner than the depth of the extended drain junction region 80. The P-body region 90 is disposed to be spaced apart from the extended drain junction region 80 by a predetermined distance. In addition, when the P-body region 90 is not present, the first conductivity-type well region 20 may perform the channel region instead, so that there is no need for the P-body region 90 to be formed. This is possible because the P-body region 90 and the well region 20 have the same conductivity type. The LDD region 95 is to secure a channel region, and is formed under the first gate dielectric layer 51 by performing LDD ion implantation. In the drain region 210, LDD ion implantation is not performed because the extended drain junction region 80 is formed.

The semiconductor device may further include a second conductivity type deep well region (DNW) 30. The second conductivity type deep well region 30 is desired for isolating a semiconductor device from another device. The deep well region 30 is disposed between the device isolation regions 40 and 42, and disposed to include a well region 20 of a first conductivity type. In such a case, a second conductivity type deep well pickup region 240 for applying a bias voltage to the second conductivity type deep well region 30 may be further formed. A substrate pickup region 250 is formed next to the device isolation region 42.

The semiconductor device includes the drain region 210, the body pickup region 230, and isolation regions 40 and 41 for isolating from adjacent devices. The device isolation regions 40 and 41 may be of shallow trench isolation (STI), medium trench isolation (MTI), and deep trench isolation (DTI). For the device isolation regions 40 and 41, a LOCOS oxide layer may be used instead of a trench. In addition, the trench area may be formed by filling a silicon oxide layer (SiO2), a silicon nitride layer (SiN), a poly-Si material, and the combination of thereof.

The semiconductor device may include a body pickup region 230 of a first conductivity type between the device isolation region 41 and the source region 220. The body pick-up region 230 of the first conductivity type is for applying a ground voltage to the well region 20 of the first conductivity type or the body region 90 of the first conductivity type.

As illustrated in FIG. 1B, the silicide layers 253, 243, 233, 223, and 213 is disposed on a substrate pickup region 250, a deep well contact region 240, a body pickup region 230, a portion of the source region 220, and a portion of an upper surface of the drain region 210. A source contact plug 222 is formed on the source silicide layer 223, and a drain contact plug 212 is formed on the drain silicide layer 213. In addition, a body contact plug 232 and a deep well contact plug 242 may be formed on the body contact silicide layer 233 and the deep well contact silicide layer 243, respectively. Here, the silicide layers 253, 243, 233, 223, 213 refer to regions in which CoSi2, NiSi, TiSi2, etc., are formed. The silicide layers 253, 243, 233, 223, 213 are composed of a metal-silicide material.

As illustrated in FIG. 1B, the first dielectric pattern 300 partially overlaps the source region 220 and contacts the source silicide layer 223, and is disposed to be spaced apart from the source contact plug 222 by a predetermined distance. The first dielectric pattern 300 has a first region formed on the substrate 10 and a second region formed on the gate electrode 110, and the width of the first region and the width of the second region may be formed to be substantially the same. Alternatively, the width of the first region and the width of the second region may be formed differently. The first dielectric pattern 300 is directly contacted with the source region 220, the source silicide layer 223, and the LDD region 95.

The third dielectric pattern 400 is formed to extend to the drain region 210 while covering a portion of the gate electrode 110 and the spacer 60. The third dielectric pattern 400 is disposed to partially overlap the drain region 210, contact the drain silicide layer 213, and be spaced apart from the drain contact plug 212 by a predetermined distance. The third dielectric pattern 400 has a third region formed on the gate electrode 110 and a fourth region formed on the substrate, and the width of the third region is formed to be shorter than the width of the fourth region. In addition, the third dielectric pattern 400 is formed in direct contact with the extended drain junction region 80 of the second conductivity type, the drain region 210, and the drain silicide layer 213.

The top surface of the gate electrode 110 is formed in direct contact with the gate silicide layer 120, the first dielectric pattern 300, and the third dielectric pattern 400. In addition, the first dielectric pattern 300 and the third dielectric pattern 400 are formed to be spaced apart from the gate contact 111.

As described above, an LDD dielectric pattern is formed on one side of the gate electrode 110 in the direction of the source region 220. The spacer 60 and the non-sal dielectric pattern are formed on the other side of the gate electrode 110 in the direction of the drain region 210, so that leakage current between the gate electrode-the source region and the gate electrode-the drain region may be reduced.

The plan view and cross-sectional view of semiconductor devices of other examples described below are mostly similar to FIG. 1A, B described above, and for convenience of explanation, the same components as in FIG. 1A, B are denoted by the same reference numerals, and differences are mainly described.

Figure 2A:
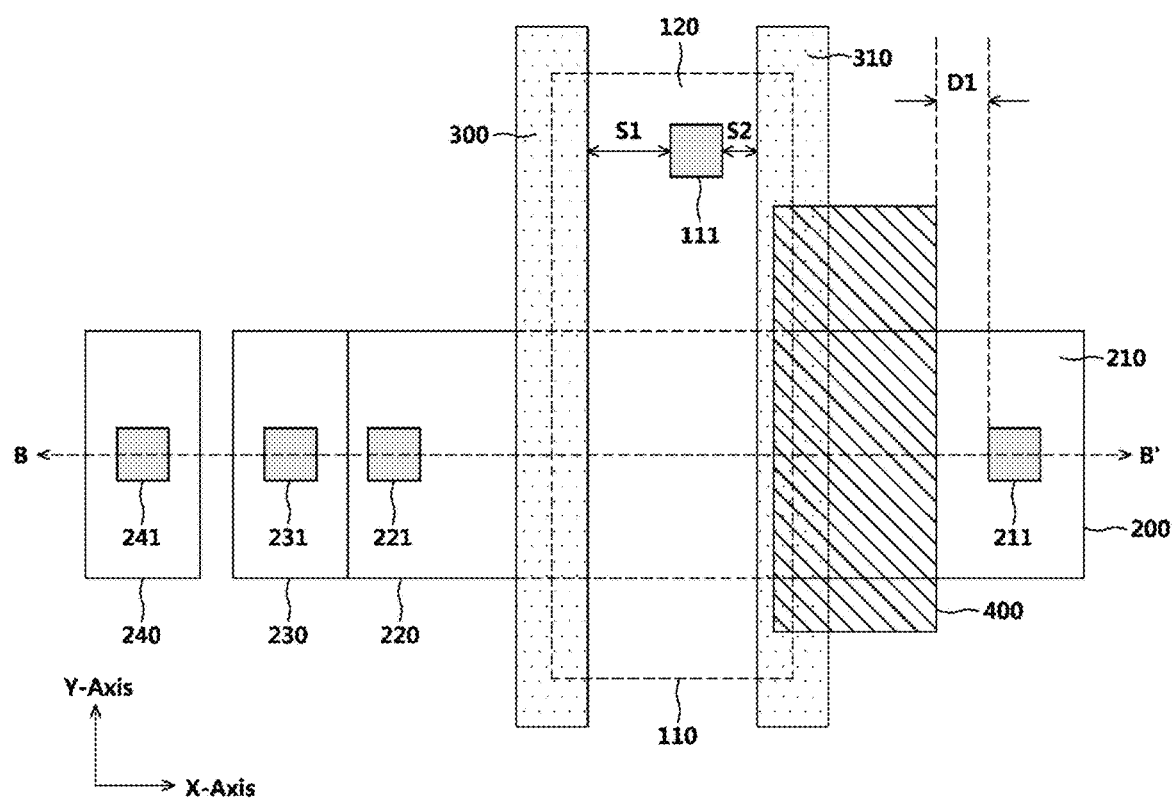
FIG. 2A is a plan view of a semiconductor device according to a second example of the present application.
Figure 2B:
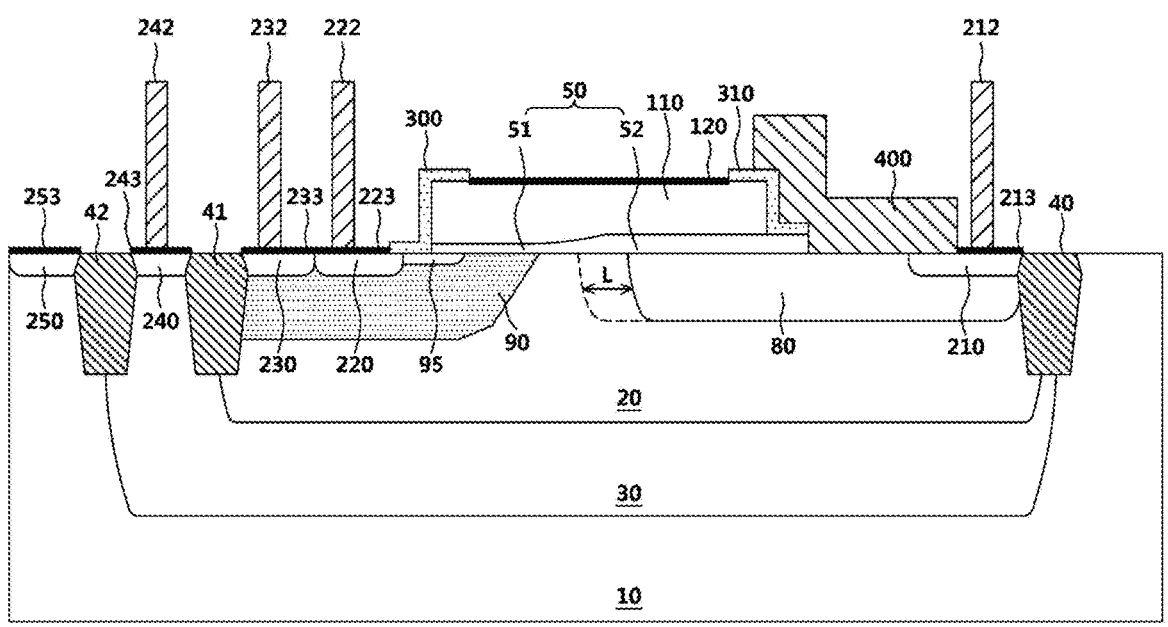
FIG. 2B is a cross-sectional view of a semiconductor device with respect to line B-B' of FIG. 2A.

FIG. 2A is a plan view of the semiconductor device according to the second example of the present application, and FIG. 2B is a cross-sectional view of the semiconductor device with respect to line B-B' of FIG. 2A.

Referring to FIG. 2A, the semiconductor device includes a first dielectric pattern 300, a second dielectric pattern 310, and a third dielectric pattern 400. Three dielectric layer patterns are formed in the semiconductor device illustrated in FIG. 1A, and a second dielectric pattern 310 is further formed. The first dielectric pattern 300 and the second dielectric pattern 310 are formed by etching the LDD dielectric layer. The first dielectric pattern 300 and the second dielectric pattern 310 are formed of the same material. The shape, size, and area of the first dielectric pattern 300 and the second dielectric pattern 310 are determined in the process of forming a lightly doped region or a lightly doped drain (LDD). The third dielectric pattern 400 is a non-sal dielectric pattern formed by a non-sal process.

As illustrated in FIG. 2A, the first dielectric pattern 300 is formed over a portion of the source region 220 and the gate electrode 110, and the second dielectric pattern 310 is formed over the drain region 210 and a portion of the gate electrode 110. It may be a symmetrical structure with the same width and length. A gate silicide layer 120 is formed on the gate electrode 110 on which the first dielectric pattern 300 and the second dielectric pattern 310 are not formed. The first dielectric pattern 300 and the second dielectric pattern 310 are disposed to be spaced apart from each other. In addition, because it is configured as a symmetrical structure on opposite sides of the gate electrode 110 as illustrated in FIG. 2A, the pattern forming process is more stable and advantageous than when one dielectric pattern is formed, as illustrated in FIG. 1A.

The first dielectric pattern 300 and the second dielectric pattern 310 disposed on opposite sides with respect to the gate contact 111 are spaced apart by s1 and s2, respectively. The separation distances s1 and s2 may be designed to be the same or different. In the semiconductor device of the example, the distance s1 between the first dielectric pattern 300 and the gate contact 111 is formed to be greater than the distance s2 between the second dielectric pattern 310 and the gate contact 111.

As illustrated in FIG. 2A, the third dielectric pattern 400 is formed to partially overlap on the second dielectric pattern 310 and formed over a portion of the drain region 201. The third dielectric pattern 400 has a wider width (X-axis direction) and a shorter length (Y-axis direction) than the second dielectric pattern 310. The third dielectric pattern 400 and the drain contact 211 are spaced apart by a distance 'D1'.

FIG. 2B is a cross-sectional view of a semiconductor device according to an example of the present application with respect to line B-B' of FIG. 2A. A second dielectric layer 310 is further formed on the gate electrode 110 in the drain direction than the semiconductor device structure illustrated in FIG. 1B described above.

The first dielectric pattern 300 is formed on the source region 220 side, and the source region 220 is formed overlapping a portion of the first dielectric pattern 300. In addition, a second dielectric pattern 310 is formed on the drain region 210 side instead of the spacer of FIG. 1B. The third dielectric pattern 400 is formed overlapping with a portion of an upper surface and a sidewall of the gate electrode 110 and a portion of the second gate dielectric layer 52. The gate dielectric layer 50 formed on the well region 20 includes a first gate dielectric layer 51 and a second gate dielectric layer 52 having different thicknesses. The second gate dielectric layer 52 is formed to further extend in the direction of the drain region 210 from the gate electrode 110. The first dielectric pattern 300 and the second dielectric pattern 310 have the same thickness. In addition, a gate silicide layer 120 is formed on the gate electrode 110 between the first dielectric pattern 300 and the second dielectric pattern 310.

As illustrated in FIG. 2B, the third dielectric pattern 400 is formed to extend to the drain region 210 while covering the second dielectric pattern 310. The third dielectric pattern 400 is formed to be thicker than the first dielectric pattern 300 and the second dielectric pattern 310. The third dielectric pattern 400 is thickened to prevent the third dielectric pattern 400 from being removed by various etching processes performed in a subsequent process.

As illustrated in FIG. 2B, the first dielectric pattern 300 is disposed to partially overlap the source region 220, contact the source silicide layer 223, and be spaced apart from the source contact plug 222 by a predetermined distance. The first dielectric pattern 300 is directly contacted with the source region 220, the source silicide layer 223, and the LDD region 95. The second dielectric pattern 310 is disposed to be spaced apart from the extended drain junction region 80 of the second conductivity type by the second gate dielectric layer 52. One side of the second dielectric pattern 310 and the second gate dielectric layer 52 are aligned and disposed on the extended drain junction region 80. The third dielectric pattern 400 is formed to extend to the drain region 210 while covering the second dielectric pattern 310. The third dielectric pattern 400 is disposed to partially overlap the drain region 210, contact the drain silicide layer 213, and be spaced apart from the drain contact plug 212 by a predetermined distance. In addition, the third dielectric pattern 400 is formed in direct contact with a second dielectric pattern 310, a second gate dielectric layer 52, an extended drain junction region 80 of a second conductivity type, a drain region 210, and a drain silicide layer 213.

Figure 3A:
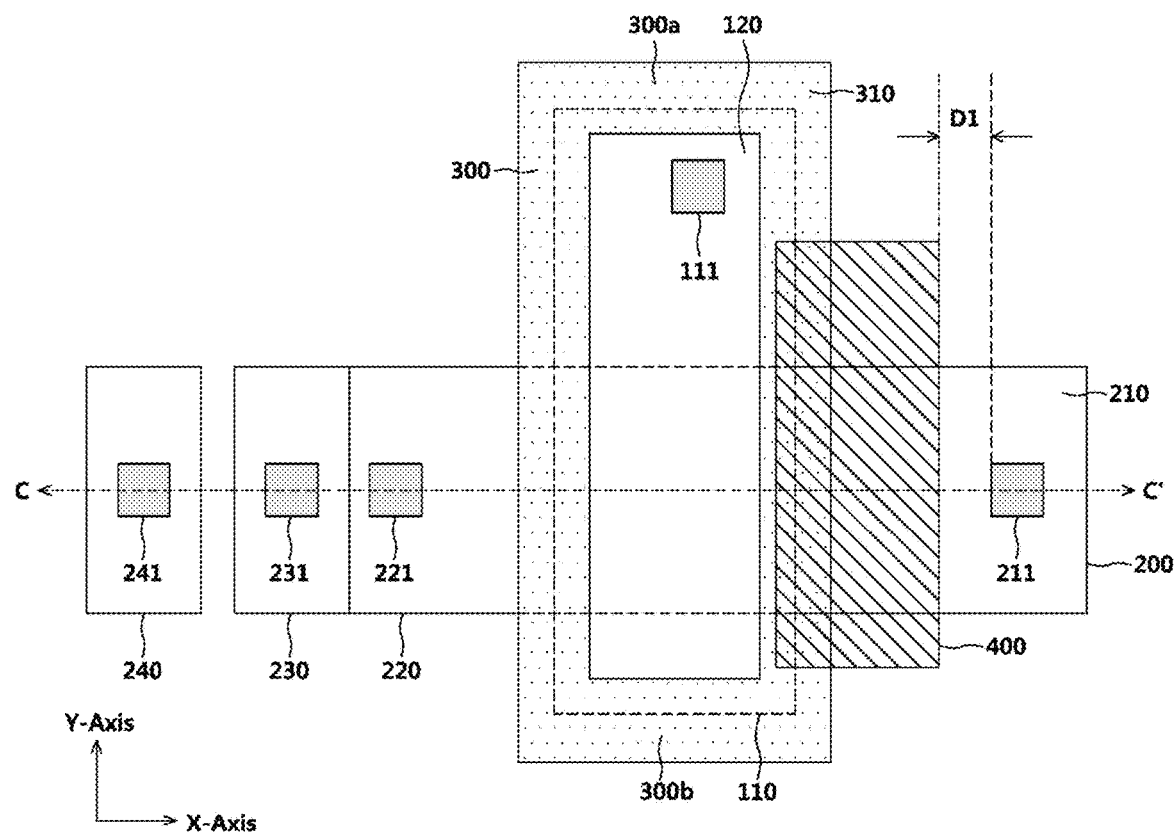
FIG. 3A is a plan view of a semiconductor device according to a third example of the present application.
Figure 3B:
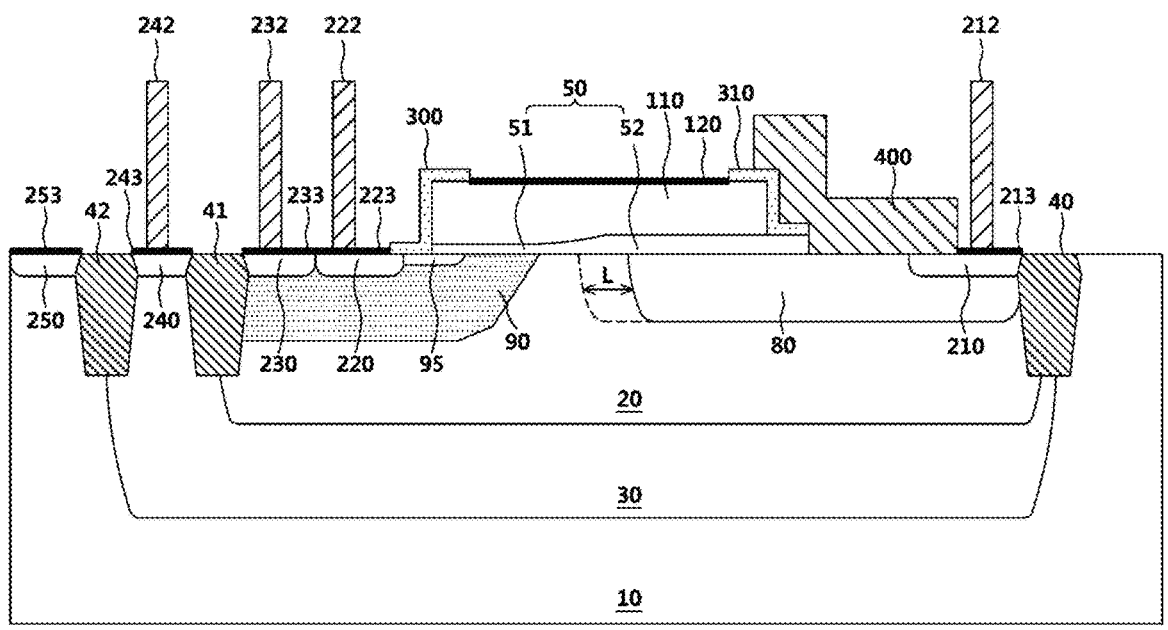
FIG. 3B is a cross-sectional view of a semiconductor device with respect to line C-C' of FIG. 3A.

FIG. 3A is a plan view of a semiconductor device according to a third example of the present application, and FIG. 3B is a cross-sectional view of the semiconductor device with respect to line C-C' of FIG. 3A. The third example is also to be described mainly on the differences from the above-described configurations and examples.

Referring to FIG. 3A, the semiconductor device includes a first dielectric pattern 300, a second dielectric pattern 310, and a third dielectric pattern 400. The first dielectric pattern 300 and the second dielectric pattern 310 have upper and lower extension units 300a and 300b formed at upper and lower parts and connected, respectively. Therefore, the dielectric patterns 300 and 310 of FIG. 3A have a shape that surrounds the edge of the gate electrode 110 in a substantially quadrangular ring shape. It is in contact with all four surfaces of the gate electrode 110. When the lengths of the upper/lower extension units 300a and 300b are adjusted, the distance between the first dielectric pattern 300 and the third dielectric pattern 400 may be adjusted.

The first dielectric pattern 300 and the second dielectric pattern 310 are disposed to be spaced apart from the gate contact 111 by a predetermined distance. The gate silicide layer 120 is designed to be formed on the gate electrode 110 on which the first dielectric pattern 300 and the second dielectric pattern 310 are not formed. The first dielectric pattern 300 overlaps the source region 220 and a portion of the edge of the adjacent gate electrode. The second dielectric pattern 310 overlaps the drain region 210 and a portion of the edge of the adjacent gate electrode.

Referring to FIG. 3A, the semiconductor device includes a third dielectric pattern 400 on the drain region 210 side. The third dielectric pattern 400 is a square shape when viewed from above and is partially disposed on a portion of the second dielectric pattern 310 and the upper surface of the drain region 210. One end of the third dielectric pattern 400 is disposed to partially overlap the second dielectric pattern 310, and the other end is formed to be spaced apart from the drain contact 211 by a distance 'D1'.

FIG. 3B is a cross-sectional view of a semiconductor device with respect to line C-C' of FIG. 3A. That is, when comparing FIGS. 2B and 3B, trench isolation regions 40, 41 and 42, a deep well region 30, a well region 20, a source region 22, an extended drain junction region 80, a drain region 210, a body region 90 and other pickup regions 230, 240, 250, contact plugs 212, 222, 232, 242, and the like formed on a semiconductor substrate are similar. In addition, the gate dielectric layers 50, 51 and 52, the gate electrode 110, the silicide layers 120, 213, 223, 233, 243, 253, and the first dielectric pattern 300 have similar structures. Here, the gate dielectric layer includes a first gate dielectric layer and a second gate dielectric layer thicker than the first gate dielectric layer.

Here, the first dielectric pattern 300 is formed in direct contact with the LDD region 95, the gate silicide layer 120, the source silicide layer 223, and the source region 220. The first dielectric pattern 300 is the form of being connected to each other.

FIG. 3B is different from FIG. 1B in that the second dielectric pattern 310 is formed instead of the spacers (FIG. 1B, 60). Like the first dielectric pattern 300, the second dielectric pattern 310 is connected to each other. When the first dielectric pattern 300 is formed on one sidewall of the gate electrode 110 near the source region 220, the second dielectric pattern 310 is formed on the other sidewall of the gate electrode 110 near the drain region 210. One end of the second dielectric pattern 310 is formed on the second gate dielectric layer 52, and the other end is formed extending to a portion of the upper part of the gate electrode 110. One end of the second dielectric pattern 310 is formed by being aligned with the end of the thick second gate dielectric layer 52. That is, because the second dielectric pattern 310 and the second gate dielectric layer 52 are etched simultaneously, the end of the second dielectric pattern and the end of the second gate dielectric layer are formed to be aligned. The first dielectric pattern and the second dielectric pattern are formed to be spaced apart from each other. Because the LDD dielectric layer is deposited and patterned to form the first and second dielectric patterns, the same material forms the first and second dielectric patterns.

In addition, a third dielectric pattern 400 is formed on the substrate by covering a portion of the substrate, contacting the second dielectric pattern, and contacting the gate silicide layer 120. The first dielectric pattern and the third dielectric pattern are formed to be spaced apart from each other. The third dielectric pattern is formed by contacting the gate dielectric layers 50 and 52 and contacting the drain region 210 and the drain silicide layer 213. However, the third dielectric pattern is formed to be spaced apart from the drain contact plug 212. The third dielectric pattern is formed to be thicker than the second dielectric pattern.

The following example is an example of a semiconductor device in which a non-sal dielectric pattern is not formed, and only an LDD dielectric pattern is formed.

Figure 4A:
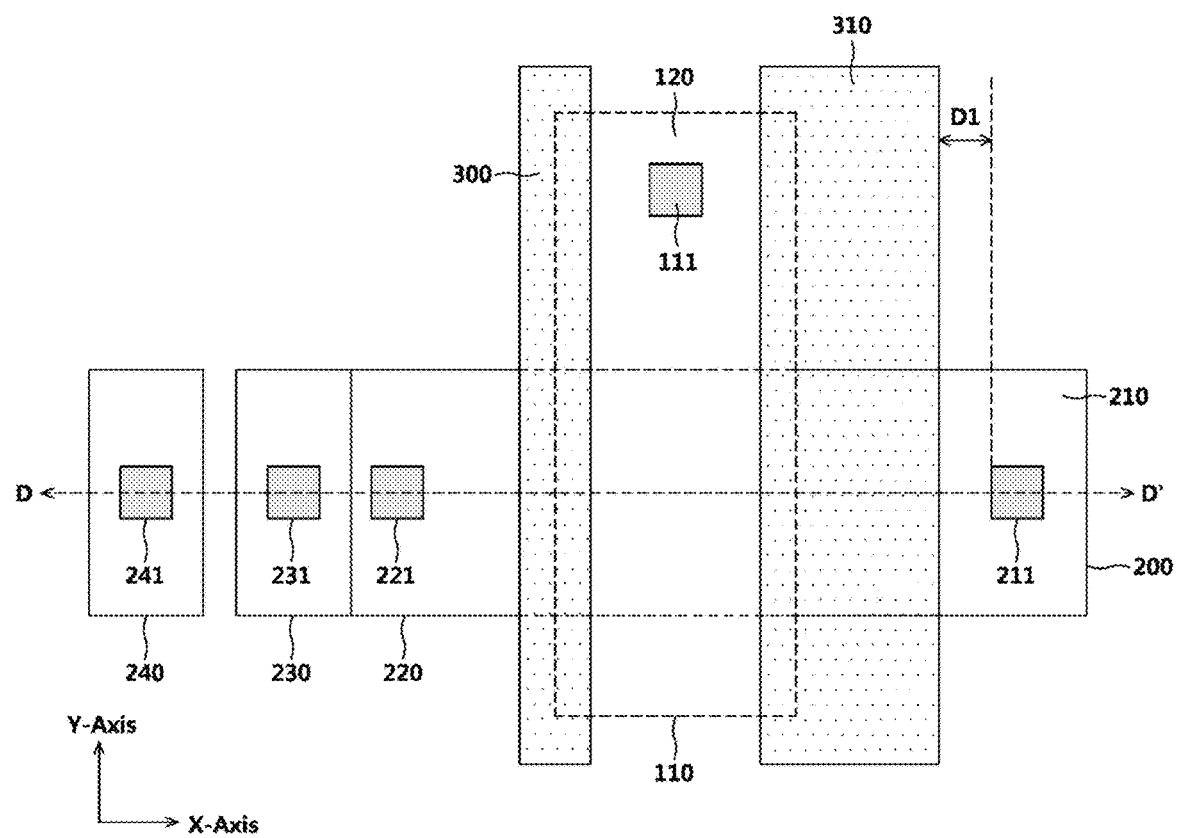
FIG. 4A is a plan view of a semiconductor device according to a fourth example of the present application.

Referring to FIG. 4A, the semiconductor device includes a first dielectric pattern 300 and a second dielectric pattern 310, which are LDD dielectric patterns formed on opposite sides of the gate electrode 110. The first dielectric pattern 300 and the second dielectric pattern 310 are LDD dielectric patterns formed by etching the LDD dielectric layer. The first dielectric pattern 300 is formed over the source region 220 and the gate electrode 110 and is designed to be spaced apart from the source contact 221 and the gate contact 111, respectively.

The second dielectric pattern 310 is spaced apart from the first dielectric pattern 300 by a predetermined distance, and is formed over the gate electrode 110 and the drain region 210. In addition, a size is formed to be larger than that of the first dielectric pattern 300. As illustrated in FIG. 4A, the second dielectric pattern 310 has a predetermined size extending in the direction of the drain region 210 to be spaced apart from the drain contact 211 by a distance D1. The distance D1 corresponds to the distance mentioned in FIGS. 1B, 2B, and 3B. Therefore, the second dielectric pattern 310 illustrated in FIG. 4A may be formed by being extended as much as the width of the third dielectric pattern 400. In the semiconductor device of FIG. 4A, the second dielectric pattern 310 serves as the spacer 60 and the non-sal dielectric pattern 400 described in FIGS. 1B to 3B.

In addition, a gate silicide layer 120 is formed on the gate electrode 110 in a region where the first dielectric pattern 300 and the second dielectric pattern 310 are not formed.

Figure 4B:
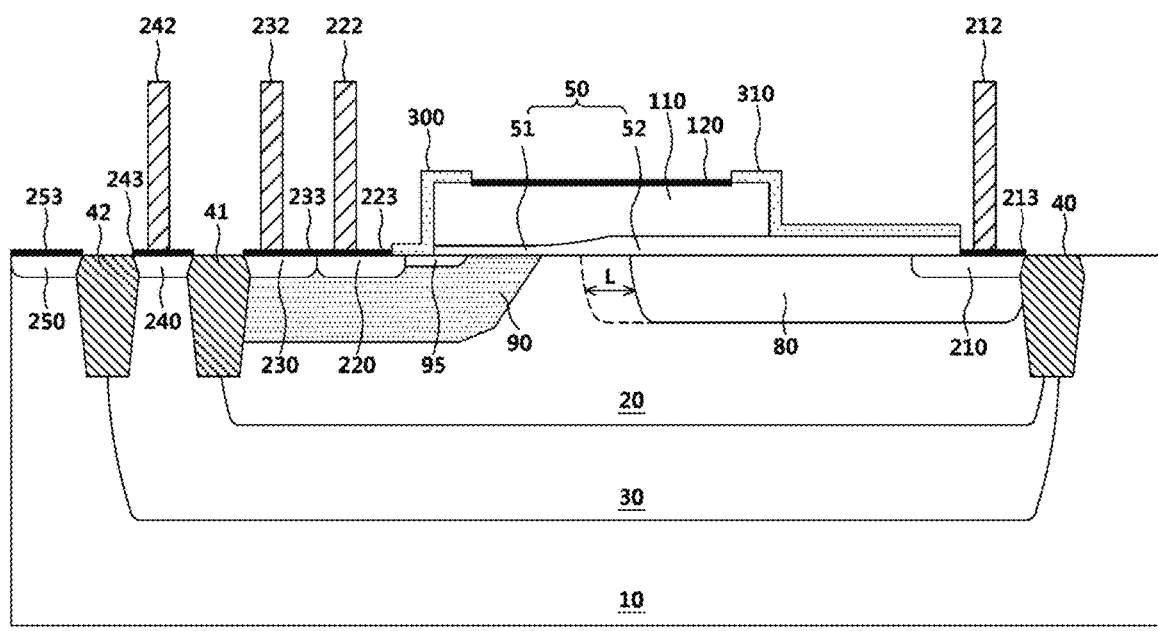
FIG. 4B is a cross-sectional view of a semiconductor device with respect to line D-D' of FIG. 4A.

FIG. 4B illustrates a cross-sectional view with respect to line D-D' of FIG. 4A. The semiconductor device includes a first gate dielectric layer 51 and a second gate dielectric layer 52 having different thicknesses on the well region 20. The gate electrode 110 is disposed on the gate dielectric layer 50. A drain region 210 and a source region 220 are formed in the well region 20 and are disposed on opposite sides under the gate dielectric layer 50, respectively.

The gate dielectric layer 50 may include a first gate dielectric layer 51 and a second gate dielectric layer 52 having different thicknesses. For example, the first gate dielectric layer 51 may be thinner than the second gate dielectric layer 52, and the second gate dielectric layer 52 may be formed to be thicker than the first gate dielectric layer 51.

As illustrated in FIG. 4B, a thin first gate dielectric layer 51 is disposed near the source region 220, and a thick second gate dielectric layer 52 is disposed near the drain region 210. In addition, the second gate dielectric layer 52 and the second dielectric pattern 310 have a structure that has a length extended to be longer compared to the previous example. The second gate dielectric layer 52 and the second dielectric pattern 310 are designed to be extended in the direction of the drain region 210 to contact the drain silicide layer 213, and disposed to be spaced apart from the drain contact plug 212 by a predetermined distance. As FIG. 4B illustrates, the second gate dielectric layer 52 of the semiconductor device is formed to be longer than the first gate dielectric layer 51.

A first dielectric pattern 300 and a second dielectric pattern 310 are formed on opposite sides of the gate electrode 110. The first dielectric pattern 300 is formed on the source region 220 side, and the source region 220 is formed overlapping a portion of the first dielectric pattern 300. In addition, a second dielectric pattern 310 is formed on the drain region 210 side. The second dielectric pattern 310 is spaced apart from the first dielectric pattern 300 and formed to the drain region 210 while covering the top surface and sidewall of the gate electrode 110. The second gate dielectric layer 52 formed to be extended to be longer. An end of the second dielectric pattern 310 is aligned with an end of the second gate dielectric layer 52, and is spaced apart from the drain contact plug 212 by a predetermined distance.

In the semiconductor device of FIG. 4B in which a spacer is not formed on the sidewall of the gate electrode 110, and the second dielectric pattern 310 serves as a spacer and a non-sal. In addition, the drain region 210 under the second gate dielectric layer 52 is formed by being ion-implanted after forming the second dielectric pattern 310. The second dielectric pattern 310 serves as a mask.

Figure 5A:
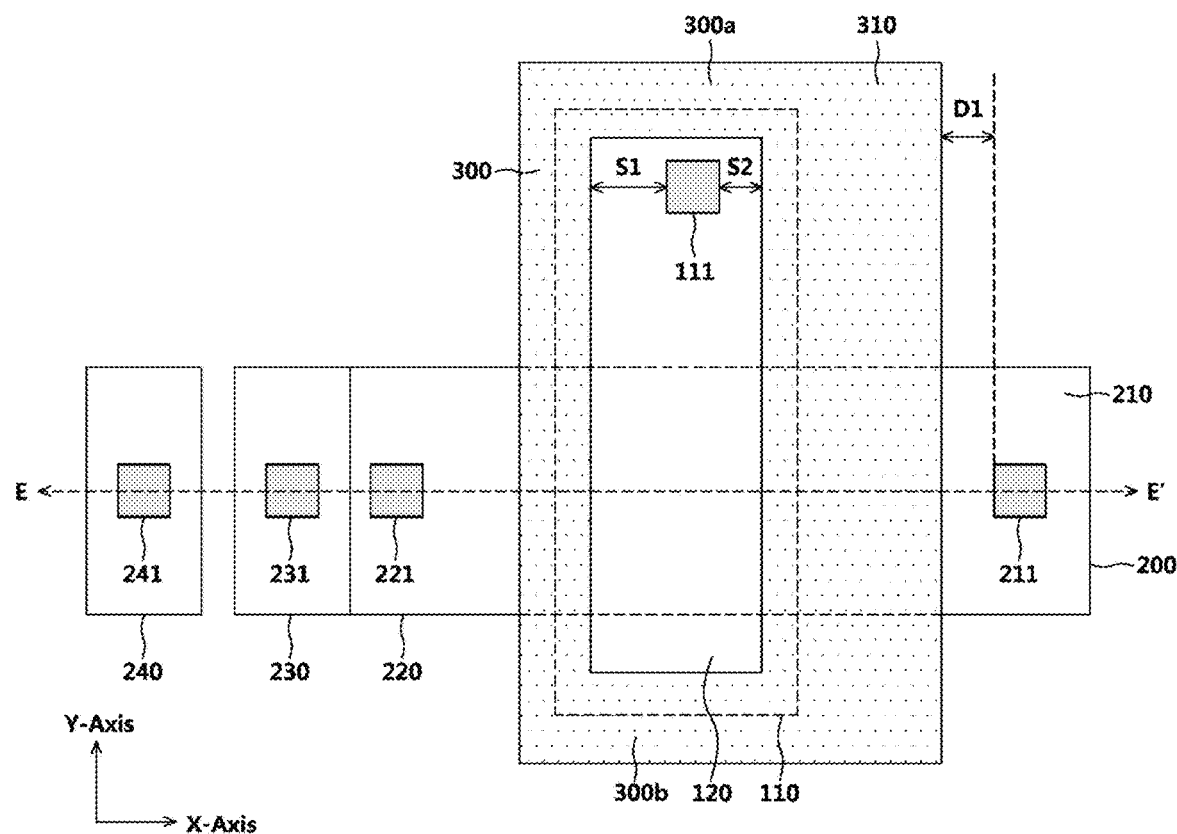
FIG. 5A is a plan view of a semiconductor device according to a fifth example of the present application.

FIG. 5A is a plan view of a semiconductor device, according to a fifth example of the present application. FIG. 5A is a structure without spacers as FIG. 4A, and an example in which a dielectric pattern is formed only with an LDD dielectric pattern. FIG. 5A is a structure in which upper/lower parts of the first dielectric pattern 300 and the second dielectric pattern 310 are extended and connected in the semiconductor device illustrated in FIG. 4A. Compared with FIG. 4A, the area of the gate silicide layer 120 is further reduced.

Referring to FIG. 5A, the first dielectric pattern 300, the second dielectric pattern 310, the upper extension unit 300a, and the lower extension unit 300b may be included, and may be substantially one LDD dielectric pattern.

The first dielectric pattern 300 and the second dielectric pattern 310 are spaced apart from the source contact 221 and the drain contact 211 by a predetermined distance, respectively. It is also spaced apart from the gate contact 111 formed on the gate silicide layer 120. The first dielectric pattern 300 and the second dielectric pattern 310, disposed in the left-right direction with respect to the gate contact 111, are disposed to be spaced apart by s1 and s2, respectively. The distances s1 and s2 may be designed in various ways, but in the example of FIG. 5A, s1 is formed to be greater than s2.

Figure 5B:
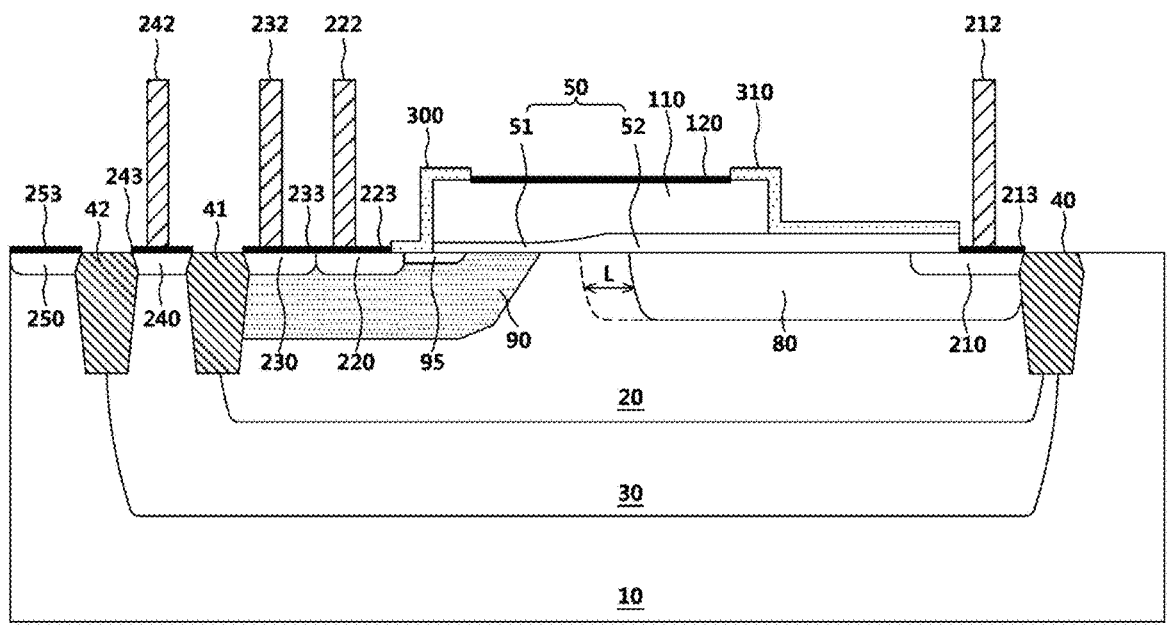
FIG. 5B is a cross-sectional view of the semiconductor device with respect to line E-E' of FIG. 5A.

The description of the cross-sectional view of the semiconductor device of FIG. 5B is omitted because it is the same as that of FIG. 4B. The semiconductor devices illustrated in FIGS. 4A and 5A are only different in that the upper and lower parts of the first dielectric pattern 300 and the second dielectric pattern 310 are spaced apart or connected by a dielectric pattern, and other configurations are the same.

Figure 6A:
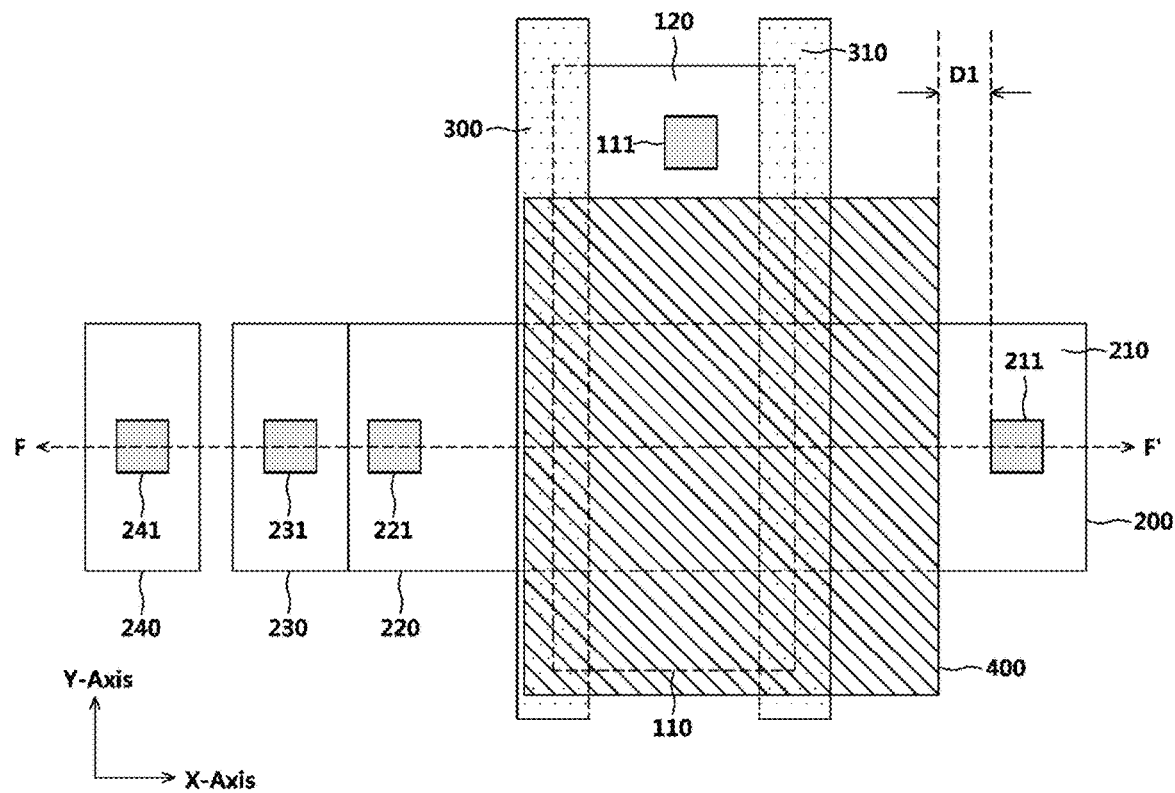
FIG. 6A is a plan view of a semiconductor device according to a sixth example of the present application.

FIG. 6A is a plan view of a semiconductor device according to a sixth example of the present application. As illustrated, the semiconductor device includes a first dielectric pattern 300 and a second dielectric pattern 310 formed by etching an LDD dielectric layer, and a third dielectric pattern 400 that is a non-sal dielectric pattern formed in a non-sal process.

The first dielectric pattern 300 and the second dielectric pattern 310 are disposed to be symmetrical on opposite sides of the gate electrode 110. The first dielectric pattern 300 is formed over the source region 220 and the gate electrode 110, and is spaced apart from the source contact 221 and the gate contact 111. The second dielectric pattern 310 is spaced apart from the first dielectric pattern 300 on the gate electrode 110, and is formed over the gate electrode 110 and the drain region 210. Similarly, it is spaced apart from the gate contact 111 and the drain contact 211.

The third dielectric pattern 400 is formed over parts of the first dielectric pattern 300, the second dielectric pattern 310, the gate electrode 110, and the drain region 210. Compared with the semiconductor device illustrated in FIG. 2A, the third dielectric pattern 400 extends longer in the direction of the source region 220 to overlap the first dielectric pattern 300, and also surrounds the lower end of the gate electrode 110. It is larger than the third dielectric pattern 400 of FIG. 2A.

The top of the gate electrode 110 is formed as a non-sal layer by the third dielectric pattern 400. As illustrated in FIG. 6A, the gate silicide layer 120 is formed only on a portion of the gate electrode 110 on which the first to third dielectric patterns 300 to 400 are not formed. The gate silicide layer 120 corresponds to a peripheral region with respect to the gate contact 111. Therefore, the area of the non-sal layer is formed to be much larger than that of the gate silicide layer 120.

As illustrated in FIG. 6A, if the third dielectric pattern 400, the non-sal layer, is formed widely in the region excluding the gate silicide layer 120, the resistance between the gate electrode 110 and the source region 220 may be increased, reducing leakage current. Therefore, it is possible to prevent damage to the source region 220 due to the leakage current.

Figure 6B:
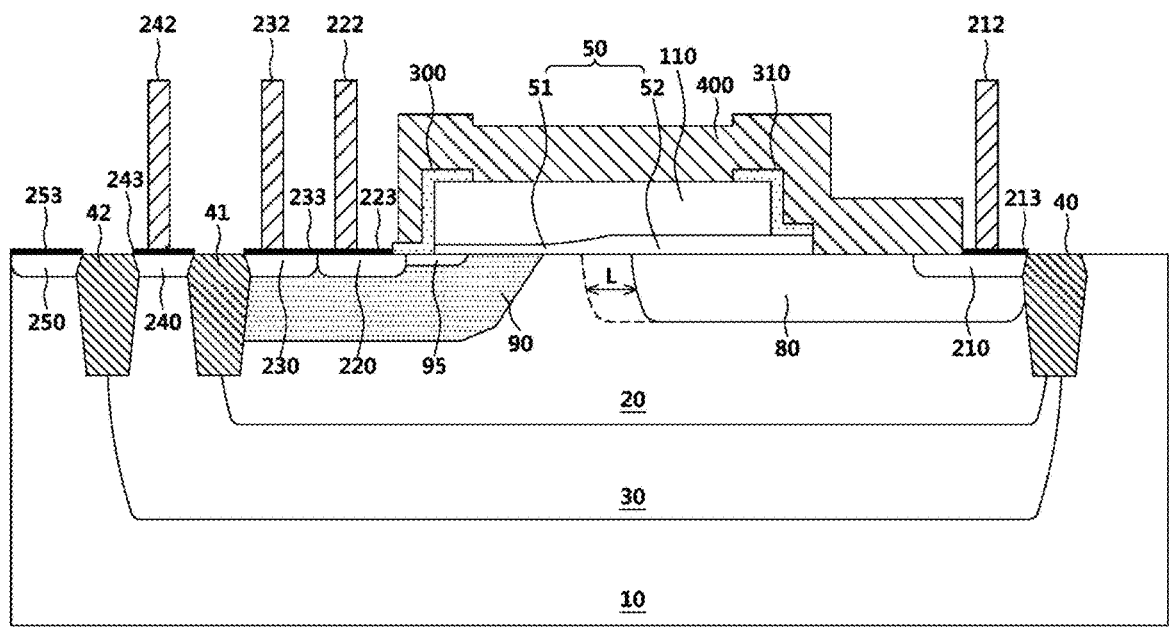
FIG. 6B is a cross-sectional view of a semiconductor device with respect to line F-F' of FIG. 6A.

The third dielectric pattern 400 is formed from the first dielectric pattern 300 to the drain region 210. FIG. 6B illustrates a range of which the third dielectric pattern 400 is formed. As illustrated in FIG. 6B, the third dielectric pattern 400 is formed to have a predetermined thickness to the drain region 210 while covering all over the first dielectric pattern 300 and the second dielectric pattern 310. The third dielectric pattern 400 is disposed to partially overlap the drain region 210 and is spaced apart from the drain silicide layer 213.

Figure 7A:
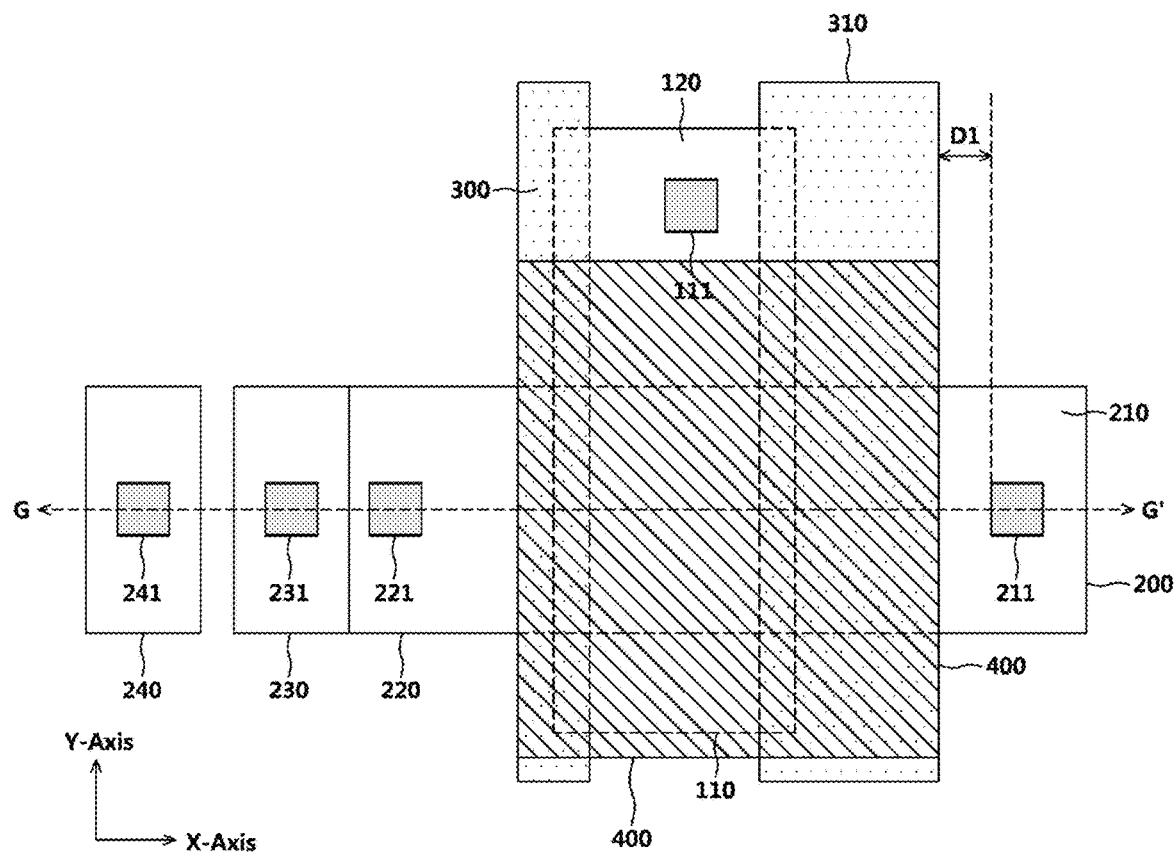
FIG. 7A is a plan view of a semiconductor device according to a seventh example of the present application.

FIG. 7A is a structure in which the second dielectric pattern 310 extends longer in the direction of the drain region 210 and is aligned with the third dielectric pattern 400 in the semiconductor device illustrated in FIG. 6A. Only the size of the second dielectric pattern 310 is formed to be larger.

Figure 7B:
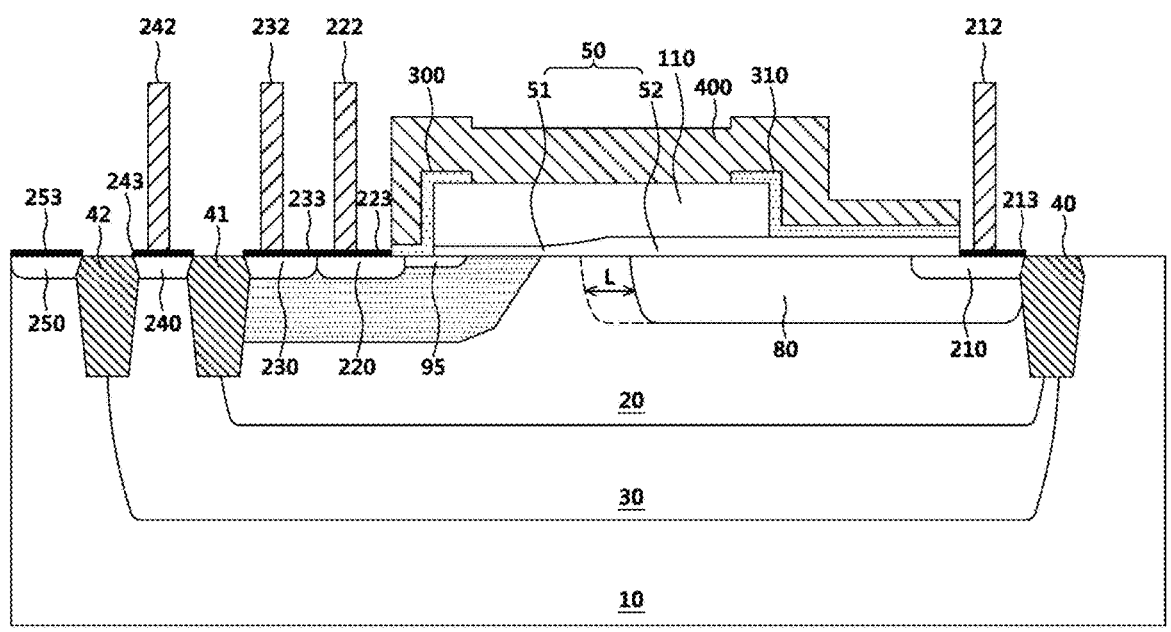
FIG. 7B is a cross-sectional view of a semiconductor device with respect to line G-G' of FIG. 7A.

Therefore, as illustrated in FIG. 7B, the second dielectric pattern 310 extends to the drain region 210 and is aligned with the third dielectric pattern 400. In such a case, the second gate dielectric layer 52 is also extended in the drain direction and is formed in a state aligned with the second dielectric pattern 310. Therefore, in the semiconductor device structure of FIG. 7B, the third dielectric pattern 310 is not in direct contact with the substrate, and the second gate dielectric layer 52 is in direct contact with the junction drain extension region 80, the drain region 210, and the drain silicide layer 213.

Figure 8A:
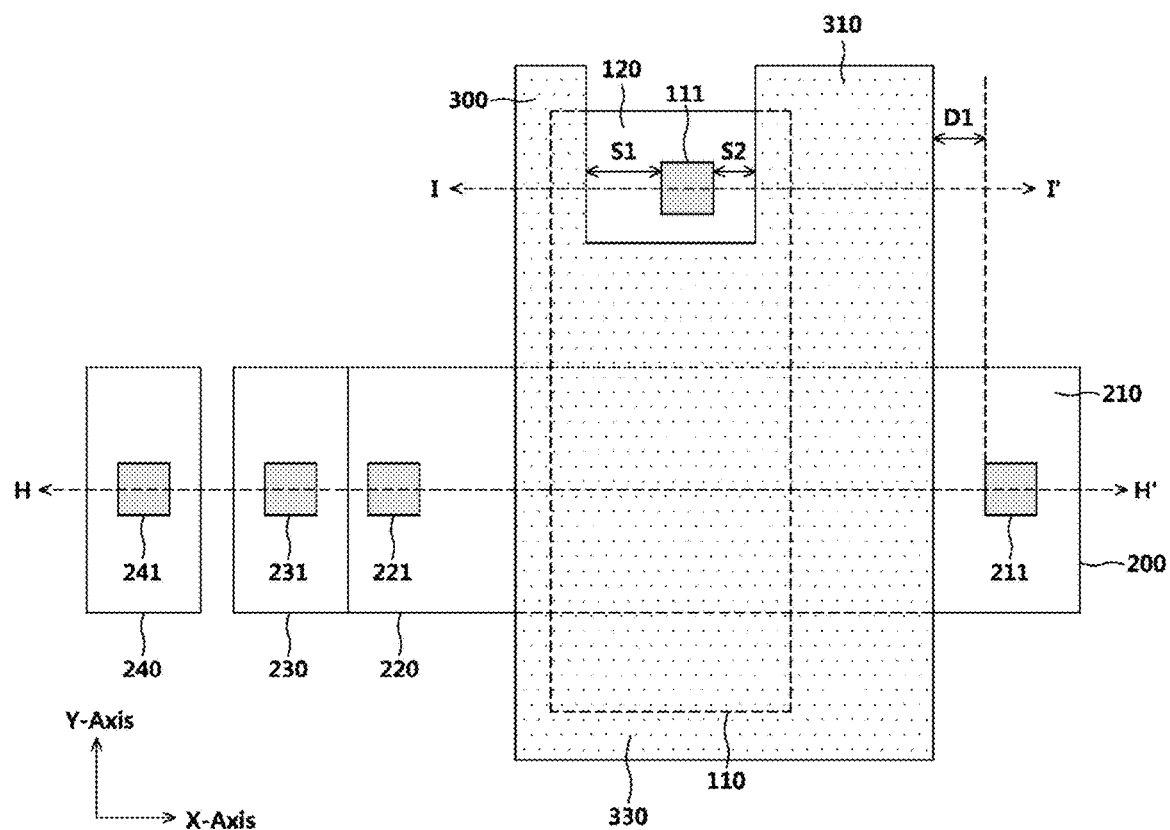
FIG. 8A is a plan view of a semiconductor device according to an eighth example of the present application.

FIG. 8A is a plan view of a semiconductor device according to an eighth example of the present application. When compared to FIG. 7A, FIG. 8A has a structure in which the third dielectric layer is not used, and the first dielectric pattern 300 and the second dielectric pattern 310 are connected to an extension unit 330. The extension unit 330 has a shape connected by being expanded longer in direction of facing in the dielectric patterns 300 and 310 below the gate contact 111. It may be referred to as one dielectric pattern because it is formed in the same process.

As illustrated in FIG. 8A, the dielectric patterns 300, 310, and 330 are formed over the gate electrode 110 and the drain region 210 excluding the periphery of the source region 220, the gate contact 111, and spaced apart by a predetermined distance from the source contact 221, the drain contact 211 and the gate contact 111. Three sides of the gate contact 111 are surrounded by the dielectric patterns 300, 310, and 330, and only one side of the upper part is exposed. The dielectric patterns 300 and 310 in the left and right directions with respect to the gate contact 111 are spaced apart by s1 and s2, respectively. The distances s1 and s2 are designed to be the same or different according to a manufacturing process when forming the first dielectric pattern 300 and the second dielectric pattern 310. In the example, the distance s1 is formed to be greater than s2. In a plan view, the semiconductor device has the first dielectric pattern and the second dielectric pattern being in contact with each other, and areas of the first and second dielectric patterns being formed to cover the upper surfaces of all the gate electrodes except for the gate silicide.

Figure 8B:
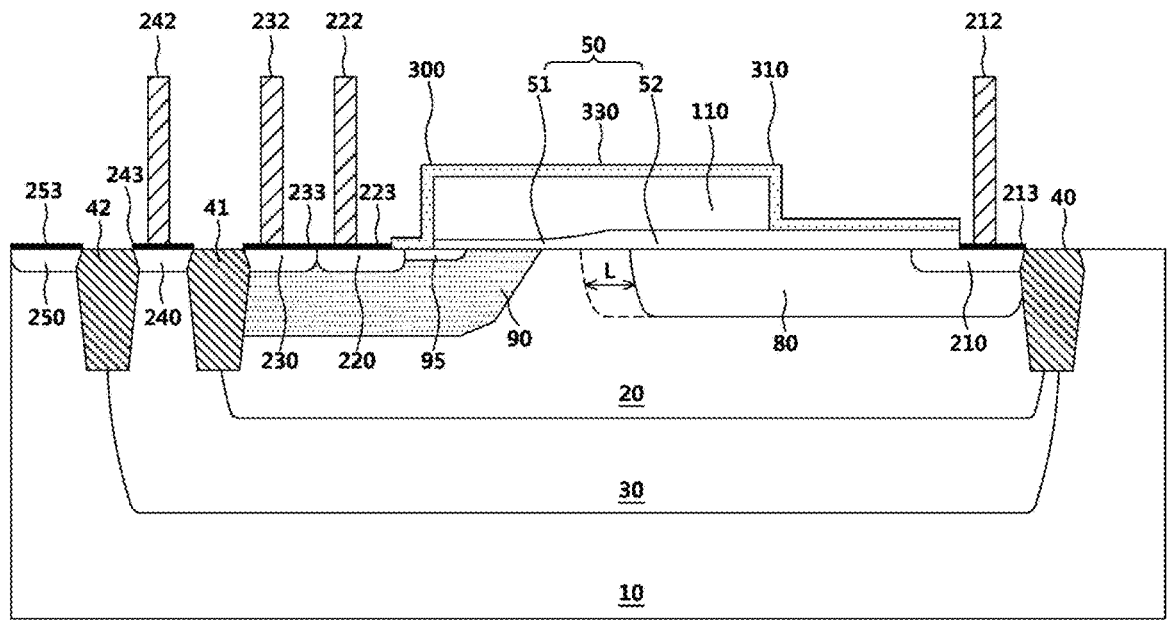
FIG. 8B is a cross-sectional view of a semiconductor device with respect to line H-H' of FIG. 8A.

FIG. 8B is a cross-sectional view of a semiconductor device according to an example of the present application with respect to line H-H' of FIG. 8A. As illustrated in FIG. 8B, the first dielectric pattern 300 partially overlaps the source region 220 and contacts the source silicide layer 223, and is disposed to be spaced apart from the source contact plug 222 by a predetermined distance. In addition, the second dielectric pattern 310 is formed to extend towards the drain region 210. Due to the length of the second dielectric pattern 310, the second gate dielectric layer 52 thereunder extends similarly and is aligned. The extended part of the second gate dielectric layer 52 is in contact with the extended drain junction region 80, the drain region 210, and the drain silicide layer 213.

As illustrated in FIG. 8B, an extension unit 330 connecting the first dielectric pattern 300 and the second dielectric pattern 310 is formed on the upper surface of the gate electrode 110. The extension unit 330 is formed on the gate electrode 110.

Figure 8C:
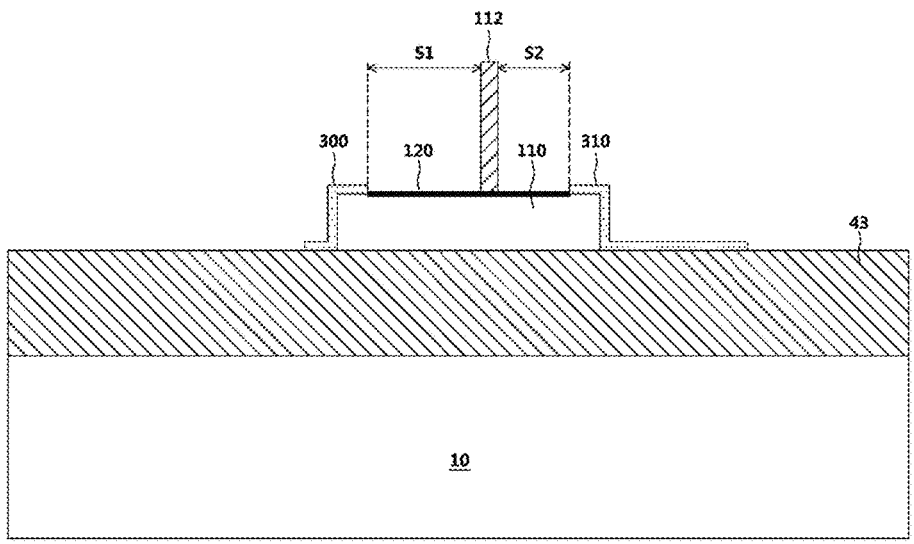
FIG. 8C is a cross-sectional view of a semiconductor device with respect to line I-I' of FIG. 8A.

FIG. 8C is a cross-sectional view of a semiconductor device according to an example of the present application with respect to line I-I' of FIG. 8A. As illustrated in FIG. 8C, the semiconductor device includes a substrate 10 and an isolation region 43 formed on the substrate 10. A gate electrode 110 is formed on the substrate 10, and a first dielectric pattern 300 and a second dielectric pattern 310 are disposed on opposite sides of the gate electrode 110. The length of the second dielectric pattern 310 is formed to be longer than that of the first dielectric pattern 300.

A gate contact plug 112 is positioned on the gate electrode 110 between the first dielectric pattern 300 and the second dielectric pattern 310. A gate silicide layer 110 is formed around the gate contact plug 112. In addition, the distance s1 between the gate contact plug 112 and the first dielectric pattern 300 is designed to be greater than the distance s2 between the gate contact plug 112 and the second dielectric pattern 310. The gate contact plug is disposed to be closer to the second dielectric pattern than to the first dielectric pattern. Alternatively, the gate contact plug is disposed to be farther from the first dielectric pattern than the second dielectric pattern. This is effective in reducing the leakage current between the gate-source region.

Figure 9A:
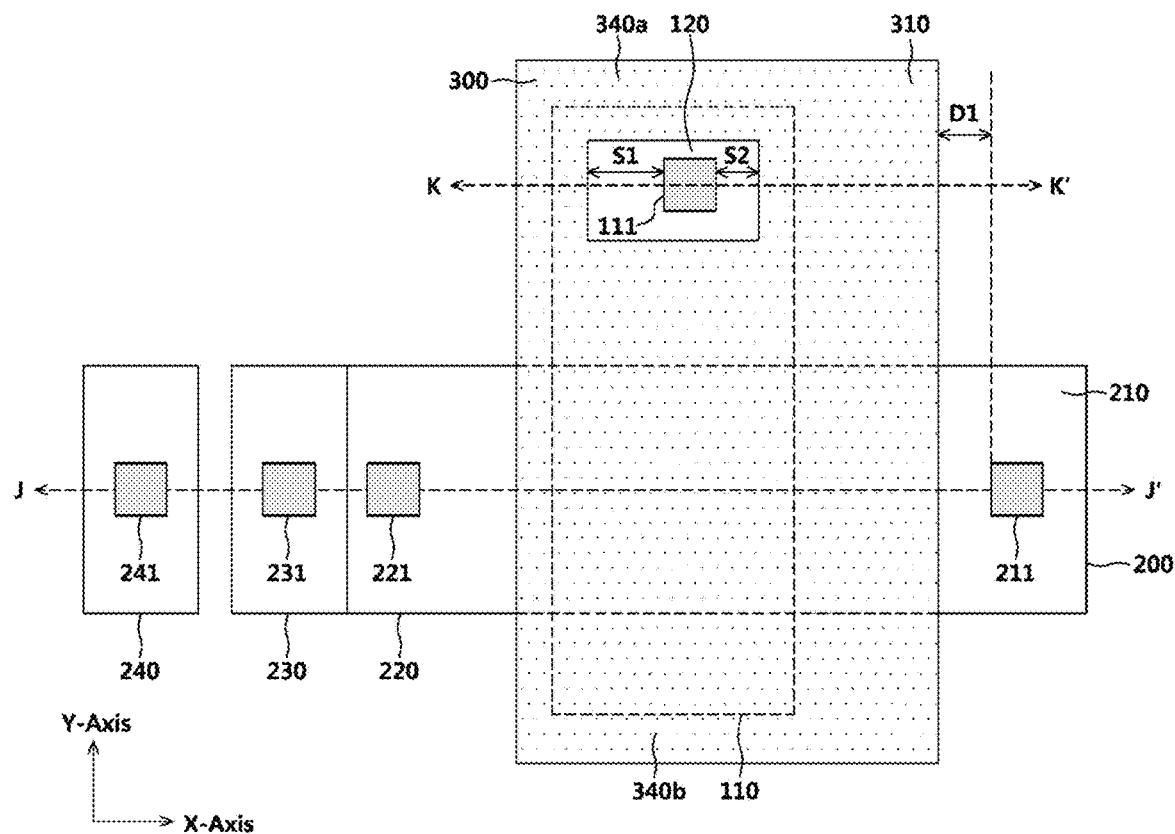
FIG. 9A is a plan view of a semiconductor device according to a ninth example of the present application.

FIG. 9A is a structure in which the upper parts of the first dielectric pattern 300 and the second dielectric pattern 310 are further expanded and connected in the semiconductor device illustrated in FIG. 8A. Thus, the shape completely surrounds the gate contact 111. Compared with FIG. 8A, the size of the gate silicide layer 120 is formed to be smaller.

In addition, the first dielectric pattern 300 and the second dielectric pattern 310 in the left-right direction with respect to the gate contact 111 are spaced apart by s1 and s2, respectively. The distances s1 and s2 are designed to be the same or different according to a manufacturing process when forming the first dielectric pattern 300 and the second dielectric pattern 310. In the example, the distance s1 is formed to be greater than s2. The gate contact plug is disposed to be closer to the second dielectric pattern than to the first dielectric pattern. Alternatively, the gate contact plug is disposed to be farther from the first dielectric pattern than the second dielectric pattern. This is effective in reducing the leakage current between the gate-source regions.

Figure 9B:
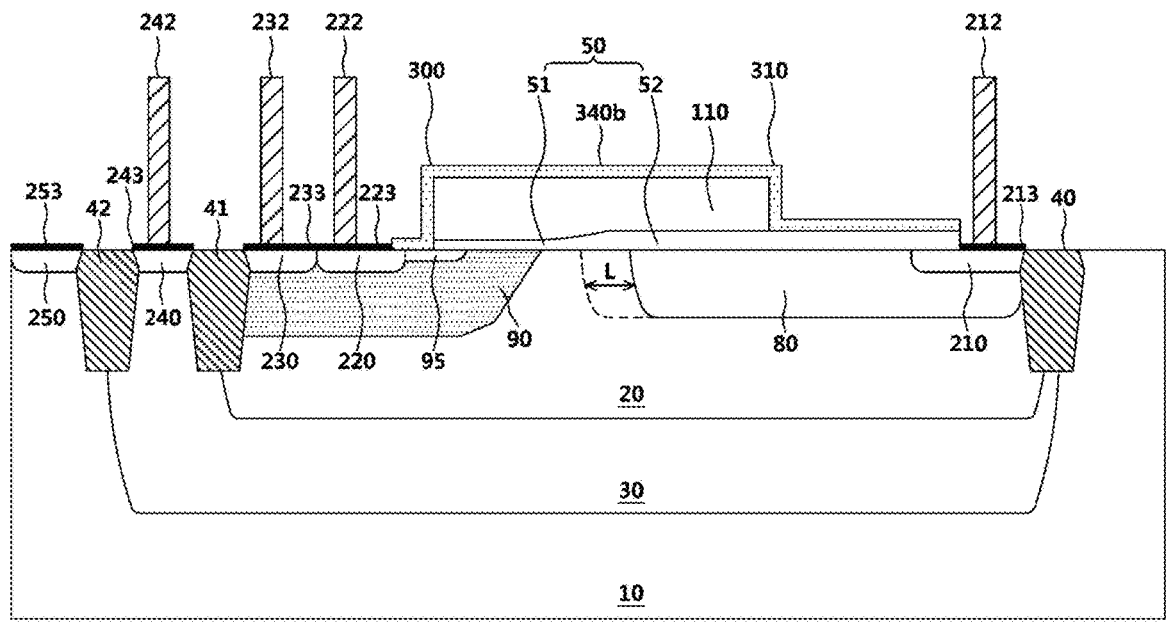
FIG. 9B is a cross-sectional view of a semiconductor device with respect to line J-J' of FIG. 9A.
Figure 9C:
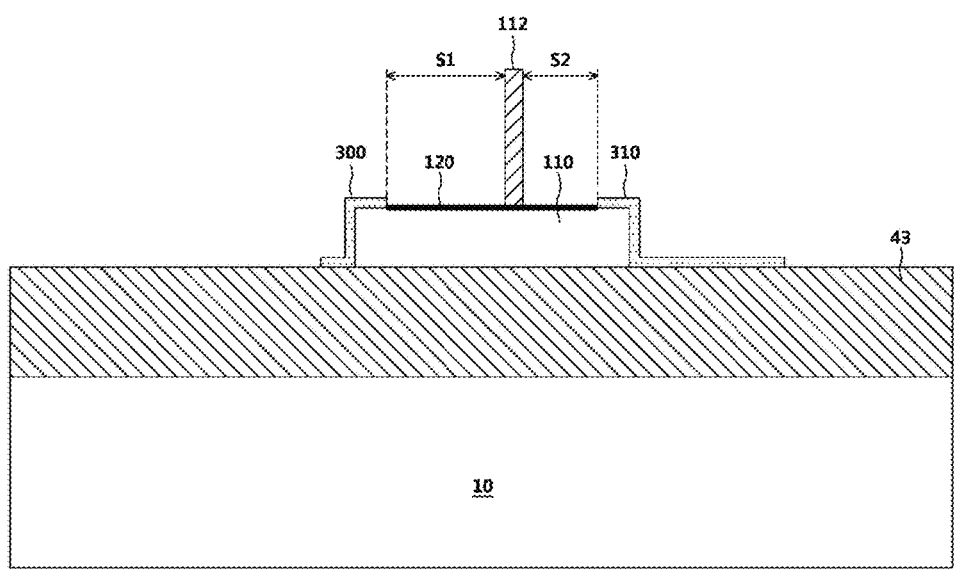
FIG. 9C is a cross-sectional view of a semiconductor device with respect to line K-K' of FIG. 9A.

FIG. 9B is a cross-sectional view of line J-J' of FIG. 9A, and FIG. 9C is a cross-sectional view of line K-K' in FIG. 9A. The cross-sectional views of FIGS. 9B and 9C correspond to FIGS. 8B and 8C. There is a difference in the formation surrounding three sides of the gate contact 111 with a dielectric layer pattern or surrounding four sides with a dielectric layer pattern. However, the rest of the configurations may be regarded to be the same.

Although described with reference to the illustrated examples of the present application, these are only exemplary, and it is apparent for the ordinary skilled person in the technical field to which the present application pertains that various variations, modifications and other equivalent examples are possible without departing from the gist and scope of the present application. Therefore, the true technical protection scope of the present application should be determined by the technical idea of the appended claims.

According to the semiconductor device of the present application as described above, the first dielectric pattern is formed on one side of the gate electrode in the source region direction, and the second dielectric pattern and the third dielectric pattern are formed on the other side of the gate electrode in the drain region direction, thereby reducing leakage current between the gate electrode-source region and the gate electrode-drain region.

According to the semiconductor device of the present application, the LDD dielectric pattern, which is a second dielectric layer formed by etching the LDD dielectric layer, is formed in the direction of the drain region, thereby effectively further increasing the resistance between the gate electrode and the drain region to reduce leakage current.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
a source region, a drain region, and a gate dielectric layer formed on a substrate;
a body region formed to surround the source region;
a gate electrode formed on the gate dielectric layer;
a first dielectric pattern, formed contacting a sidewall of the gate electrode, extending from the source region onto a portion of an upper surface of the gate electrode;
a spacer formed on another sidewall of the gate electrode between the gate electrode and the drain region;
a lightly doped drain (LDD) region formed below the gate dielectric layer to overlap a portion of the gate dielectric layer and a portion of the first dielectric pattern; and
a gate silicide layer formed between the first dielectric pattern and the spacer,
wherein the source region and the body region have different conductivity types.

2. The semiconductor device of claim 1,
wherein the spacer and the first dielectric pattern are formed of a same material,
the first dielectric pattern directly contacts the gate silicide layer, the source region, and the gate dielectric layer, and
the spacer is formed in contact with the other sidewall of the gate electrode, and an end of the spacer is formed in alignment with an end of the gate dielectric layer.

3. The semiconductor device of claim 1, further comprising a silicide blocking layer formed to cover a portion of the substrate, contact the spacer, and contact the gate silicide layer.

4. The semiconductor device of claim 3,
wherein the silicide blocking layer is formed to be spaced apart from the first dielectric pattern.

5. The semiconductor device of claim 3,
wherein the silicide blocking layer is formed in contact with the gate dielectric layer and the drain region.

6. The semiconductor device of claim 3,
wherein the silicide blocking layer is formed to be thicker than the first dielectric pattern.

7. A semiconductor device comprising:
a source region, a drain region, and a gate dielectric layer formed on a substrate, wherein the gate dielectric layer comprises a first gate dielectric layer and a second gate dielectric layer thicker than the first gate dielectric layer;
a body region formed to surround the source region;
a gate electrode formed on the gate dielectric layer;
a first dielectric pattern, formed in contact with a sidewall of the gate electrode, extending from the source region onto a portion of an upper surface of the gate electrode;
a second dielectric pattern, formed to contact another sidewall of the gate electrode, extending to another portion of the upper surface of the gate electrode; and
a gate silicide layer formed between the first dielectric pattern and the second dielectric pattern,
wherein the second dielectric pattern and the second gate dielectric layer extend onto a surface of the drain region, and
wherein the source region and the body region have different conductivity types.

8. The semiconductor device of claim 7,
wherein in a plan view, the first dielectric pattern and the second dielectric pattern are formed to meet each other and surround a periphery of the gate electrode.

9. The semiconductor device of claim 7,
wherein in a plan view, an area of the second dielectric pattern is formed to be larger than an area of the first dielectric pattern.

10. The semiconductor device of claim 7,
wherein in a plan view, the first dielectric pattern and the second dielectric pattern are in contact with each other, and the first and second dielectric patterns are formed to cover upper surfaces of the gate electrode excluding a surface of the gate silicide layer.

11. The semiconductor device of claim 7,
wherein one end of the second dielectric pattern is formed on an upper surface of the gate electrode, and another end of the second dielectric pattern is formed in alignment with an end of the second gate dielectric layer.

12. The semiconductor device of claim 7,
wherein the first and second dielectric patterns are formed of a same material, and
wherein the first dielectric pattern directly contacts the gate silicide layer, the source region, and the gate dielectric layer.

13. The semiconductor device of claim 7,
wherein the second dielectric pattern and the gate dielectric layer extend, toward the drain region, further than the other sidewall of the gate electrode.

14. The semiconductor device of claim 7, further comprising:
a deep well region formed on the substrate;
a well region formed in the deep well region; and
an extended drain junction region surrounding the drain region.

15. The semiconductor device of claim 7, further comprising:
a drain silicide layer formed on the drain region;
a drain contact plug formed on the drain silicide layer;
a source silicide layer formed on the source region; and
a source contact plug formed on the source silicide layer.

16. The semiconductor device of claim 7, further comprising a gate contact plug formed on the gate silicide layer,
wherein the gate contact plug is disposed to be closer to the second dielectric pattern than to the first dielectric pattern, and
wherein the gate contact plug is formed to be spaced apart from the first and second dielectric patterns.

17. The semiconductor device of claim 7, further comprising a third dielectric pattern formed, to cover a portion of the substrate and contact the second dielectric pattern, thicker than the second dielectric pattern.

18. The semiconductor device of claim 17,
wherein the third dielectric pattern is formed to be spaced apart from the first dielectric pattern.

19. The semiconductor device of claim 17,
wherein the third dielectric pattern is formed in contact with the gate dielectric layer and the drain region.

20. The semiconductor device of claim 17,
wherein the third dielectric pattern is formed to be thicker than the second dielectric pattern.

21. The semiconductor device of claim 17,
wherein the third dielectric pattern is formed to extend to the first dielectric pattern.

22. A semiconductor device comprising:
a source region and a drain region formed in an active region;
a body region formed to surround the source region;
a gate dielectric layer formed between the source region and the drain region;
a gate electrode formed on the gate dielectric layer;
a first dielectric pattern formed to overlap the source region and extend to a sidewall and onto a portion of an upper surface of the gate electrode;
a second dielectric pattern formed to contact another sidewall of the gate electrode and extend onto another portion of the upper surface of the gate electrode;
a gate silicide layer formed between the first dielectric pattern and the second dielectric pattern; and
a third dielectric pattern formed to overlap the gate electrode and the second dielectric pattern, and extend onto the drain region, wherein the third dielectric pattern is formed to be spaced apart from the first dielectric pattern, and
wherein the source region and the body region have different conductivity types.

23. The semiconductor device of claim 22,
wherein in a plan view, the first dielectric pattern and the second dielectric pattern are in contact with each other, and the first and second dielectric patterns are formed to cover upper surfaces of the gate electrode excluding a surface of the gate silicide layer.

24. The semiconductor device of claim 22,
wherein in a top view, the first dielectric pattern and the second dielectric pattern are formed to meet each other, and surround a periphery of the gate electrode.

25. The semiconductor device of claim 22,
wherein in a top view, an area of the second dielectric pattern is larger than an area of the first dielectric pattern.

26. The semiconductor device of claim 22, further comprising:
- a drain contact formed on the drain region;
- a source contact formed on the source region; and
- a gate contact formed on the gate region.

27. The semiconductor device of claim 26,
- wherein the gate contact is formed to be spaced apart from the first and second dielectric patterns.

28. The semiconductor device of claim 26,
- wherein the third dielectric pattern is formed to be spaced apart from the drain contact, the gate contact, and the source contact, respectively.

29. The semiconductor device of claim 22, further comprising a gate contact plug formed on the gate silicide layer,
- wherein the gate contact plug is formed to be spaced apart from the first and second dielectric patterns.

30. The semiconductor device of claim 29,
- wherein the gate contact plug is disposed to be closer to the second dielectric pattern than to the first dielectric pattern.

* * * * *